(12) United States Patent
Swaminathan et al.

(10) Patent No.: US 9,892,917 B2
(45) Date of Patent: Feb. 13, 2018

(54) PLASMA ASSISTED ATOMIC LAYER DEPOSITION OF MULTI-LAYER FILMS FOR PATTERNING APPLICATIONS

(71) Applicant: Lam Research Corporation, Fremont, CA (US)

(72) Inventors: Shankar Swaminathan, Beaverton, OR (US); Frank L. Pasquale, Beaverton, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/224,347

(22) Filed: Jul. 29, 2016

(65) Prior Publication Data

US 2016/0336178 A1    Nov. 17, 2016

Related U.S. Application Data

(60) Continuation-in-part of application No. 15/019,904, filed on Feb. 9, 2016, now Pat. No. 9,570,290, which
(Continued)

(51) Int. Cl.
*H01L 21/033* (2006.01)
*H01L 21/02* (2006.01)
(Continued)

(52) U.S. Cl.
CPC ........ *H01L 21/0337* (2013.01); *C23C 16/045* (2013.01); *C23C 16/405* (2013.01);
(Continued)

(58) Field of Classification Search
CPC ............. H01L 21/0337; H01L 21/0332; H01L 21/0228; H01L 21/02274; H01L 21/67;
(Continued)

(56) References Cited

U.S. PATENT DOCUMENTS 4,500,563 A    2/1985   Ellenberger et al.
5,223,443 A    6/1993   Chinn et al.
(Continued)

FOREIGN PATENT DOCUMENTS

CN    1732288 A    2/2006
CN    1926668 A    3/2007
(Continued)

OTHER PUBLICATIONS

U.S. Appl. No. 15/015,952, filed Feb. 4, 2016, entitled "Methods for Depositing Films on Sensitive Substrates".
(Continued)

*Primary Examiner* — Joseph C Nicely
(74) *Attorney, Agent, or Firm* — Weaver Austin Villeneuve & Sampson LLP

(57) ABSTRACT

Methods and apparatus for depositing nanolaminate films are provided. In various embodiments, the nanolaminate film may be deposited over a core layer, which may be patterned. The nanolaminate film may act as a spacer while performing a double or quadruple patterning process. The nanolaminate film may include at least two different types of film. In some cases, the two different types of film have different compositions. In some cases, the two different types of film may be deposited under different deposition conditions, and may or may not have the same composition. After the nanolaminate film is deposited, the substrate may be etched to expose the core layer. Some portions of the nanolaminate film (e.g., portions that form on sidewalls of features patterned in the core layer) may remain after etching, and may serve as a mask during later processing steps in a double or quadruple patterning process.

18 Claims, 10 Drawing Sheets

Related U.S. Application Data is a continuation of application No. 14/187,145, filed on Feb. 21, 2014, now Pat. No. 9,373,500, and a continuation-in-part of application No. 14/607,997, filed on Jan. 28, 2015, now Pat. No. 9,570,274, which is a continuation of application No. 14/133,239, filed on Dec. 18, 2013, now Pat. No. 8,999,859, which is a division of application No. 13/242,084, filed on Sep. 23, 2011, now Pat. No. 8,637,411, which is a continuation-in-part of application No. 13/084,399, filed on Apr. 11, 2011, now Pat. No. 8,728,956, said application No. 15/019,904 is a continuation-in-part of application No. 14/631,637, filed on Feb. 25, 2015, now Pat. No. 9,343,296, which is a continuation of application No. 13/738,851, filed on Jan. 10, 2013, now Pat. No. 8,993,460, application No. 15/224,347, filed on Jul. 29, 2016, which is a continuation-in-part of application No. 15/177,108, filed on Jun. 8, 2016, which is a division of application No. 14/194,324, filed on Feb. 28, 2014, now Pat. No. 9,390,909, which is a continuation-in-part of application No. 14/074,617, filed on Nov. 7, 2013, now Pat. No. 9,287,113.

(60) Provisional application No. 61/324,710, filed on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010, provisional application No. 61/724,217, filed on Nov. 8, 2012.

(51) Int. Cl.

| | | |
|---|---|---|
| *C23C 16/04* | (2006.01) | |
| *C23C 16/40* | (2006.01) | |
| *C23C 16/455* | (2006.01) | |
| *H01J 37/32* | (2006.01) | |
| *H01L 21/314* | (2006.01) | |
| *H01L 27/22* | (2006.01) | |
| *H01L 27/24* | (2006.01) | |

(52) U.S. Cl.
CPC .. *C23C 16/45542* (2013.01); *H01J 37/32082* (2013.01); *H01J 37/32192* (2013.01); *H01J 37/32449* (2013.01); *H01L 21/0228* (2013.01); *H01L 21/02164* (2013.01); *H01L 21/02172* (2013.01); *H01L 21/02186* (2013.01); *H01L 21/02274* (2013.01); *H01L 21/0332* (2013.01); *H01L 21/0334* (2013.01); *H01L 21/3141* (2013.01); *H01L 27/222* (2013.01); *H01L 27/2463* (2013.01)

(58) Field of Classification Search
CPC ........... H01L 21/0334; H01L 21/02172; H01L 21/3141; C23C 16/45542
See application file for complete search history.

(56) References Cited

U.S. PATENT DOCUMENTS

| | | |
|---|---|---|
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,069,058 A | 5/2000 | Hong |
| 6,100,202 A | 8/2000 | Lin et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,482,726 B1 * | 11/2002 | Aminpur ............ H01L 21/28123 257/E21.206 |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |

(56) References Cited

U.S. PATENT DOCUMENTS

| | | |
|---|---|---|
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,673,041 B2 | 6/2017 | Swaminathan et al. |
| 9,685,320 B2 | 6/2017 | Kang et al. |
| 9,786,570 B2 | 10/2017 | Kang et al. |
| 9,793,110 B2 | 10/2017 | Kang et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0219746 A1 | 11/2004 | Vaartstra et al. |
| 2004/0231799 A1 | 11/2004 | Lee et al. |
| 2005/0005851 A1 | 1/2005 | Keshner et al. |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0009041 A1 | 1/2006 | Iyer et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1* | 4/2008 | Wang .............. C23C 16/401 438/785 |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |

(56) References Cited

U.S. PATENT DOCUMENTS

| | | |
|---|---|---|
| 2009/0155606 A1 | 6/2009 | Yoon et al. |
| 2009/0155968 A1* | 6/2009 | Min .................. H01L 21/31105 |
| | | 438/261 |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0048011 A1* | 2/2010 | Yeh .................. H01L 21/28123 |
| | | 438/591 |
| 2010/0051578 A1 | 3/2010 | Chang et al. |
| 2010/0051579 A1 | 3/2010 | Kobayashi |
| 2010/0078316 A1* | 4/2010 | Edakawa ............. G11B 5/3163 |
| | | 204/192.34 |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0190353 A1 | 7/2010 | Nguyen et al. |
| 2010/0197129 A1* | 8/2010 | Ishikawa ......... H01L 27/115825 |
| | | 438/591 |
| 2010/0216268 A1* | 8/2010 | Katayama ......... H01L 21/32139 |
| | | 438/39 |
| 2010/0221925 A1 | 9/2010 | Lee et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee. et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0086048 A1* | 4/2012 | Park .................. H01L 21/82342 |
| | | 257/192 |
| 2012/0108079 A1 | 5/2012 | Mahajani |
| 2012/0113672 A1 | 5/2012 | Dubrow et al. |
| 2012/0161405 A1 | 6/2012 | Mohn et al. |
| 2012/0164846 A1* | 6/2012 | Ha .................... H01L 21/02153 |
| | | 438/786 |
| 2012/0193693 A1 | 8/2012 | Kanaya |
| 2012/0213940 A1 | 8/2012 | Mallick |
| 2012/0258261 A1 | 10/2012 | Reddy et al. |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0084688 A1* | 4/2013 | O'Meara ............ H01L 21/0338 |
| | | 438/478 |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1* | 3/2014 | Wang ................... C08F 220/10 |
| | | 427/126.4 |
| 2014/0094035 A1 | 4/2014 | Ji et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0041867 A1* | 2/2015 | Han .................. H01L 29/66795 |
| | | 257/288 |
| 2015/0048740 A1 | 2/2015 | Valcore, Jr. et al. |
| 2015/0093902 A1* | 4/2015 | Huang ............... H01L 21/0337 |
| | | 438/703 |
| 2015/0109814 A1 | 4/2015 | Chen et al. |
| 2015/0126042 A1* | 5/2015 | Pasquale .......... H01L 21/02274 |
| | | 438/761 |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1* | 10/2015 | Wu .................... H01L 21/76831 |
| | | 257/741 |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1* | 8/2016 | Tung ................... H01L 21/7682 |
| 2016/0260584 A1 | 9/2016 | Marakhtanov et al. |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322215 A1 | 11/2016 | Shaikh |
| 2016/0322371 A1* | 11/2016 | Yonemochi ....... H01L 27/11529 |
| 2016/0329206 A1 | 11/2016 | Kumar et al. |
| 2016/0365425 A1* | 12/2016 | Chen ................. H01L 29/6653 |
| 2016/0379826 A9 | 12/2016 | Arghavani et al. |
| 2017/0092735 A1* | 3/2017 | Hashemi ........... H01L 29/6656 |
| 2017/0103891 A1* | 4/2017 | Lee ................... H01L 21/0337 |
| 2017/0110364 A1* | 4/2017 | Song ................ H01L 21/76816 |
| 2017/0110533 A1* | 4/2017 | Huang .................... H01L 28/40 |

(56) References Cited

U.S. PATENT DOCUMENTS

| | | | |
|---|---|---|---|
| 2017/0117134 A1 | 4/2017 | Henri et al. | |
| 2017/0117150 A1* | 4/2017 | Liao | H01L 21/3086 |
| 2017/0140926 A1* | 5/2017 | Pore | H01L 21/02186 |
| 2017/0148628 A1 | 5/2017 | Swaminathan et al. | |
| 2017/0263450 A1 | 9/2017 | Swaminathan et al. | |
| 2017/0316988 A1 | 11/2017 | Kang et al. | |
| 2017/0323786 A1 | 11/2017 | Kang et al. | |

FOREIGN PATENT DOCUMENTS

| | | |
|---|---|---|
| CN | 101006195 A | 7/2007 |
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 102191479 A | 9/2011 |
| CN | 102687249 A | 9/2012 |
| CN | 102906304 A | 1/2013 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H06-177120 A | 6/1994 |
| JP | 10-98032 | 4/1998 |
| JP | H11-172439 | 6/1999 |
| JP | 2001-274404 | 10/2001 |
| JP | 2001-338922 A | 12/2001 |
| JP | 2002-9072 | 1/2002 |
| JP | 2002-134497 A | 5/2002 |
| JP | 2002-164345 A | 6/2002 |
| JP | 2005-210076 A | 8/2005 |
| JP | 2005-310927 | 11/2005 |
| JP | 2006-060091 | 3/2006 |
| JP | 2007-165883 | 6/2007 |
| JP | 2007-180362 A | 7/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-109093 A | 5/2008 |
| JP | 2008-517479 | 5/2008 |
| JP | 2008-258591 A | 10/2008 |
| JP | 2009-65203 A | 3/2009 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-245518 A | 10/2010 |
| JP | 2010-283388 A | 12/2010 |
| JP | 2011-023576 A | 2/2011 |
| JP | 2013166965 A | 8/2013 |
| JP | 2013225655 A | 10/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-20130056608 A | 5/2013 |
| TW | 200701341 | 1/2007 |
| TW | 201009942 A | 3/2010 |
| TW | 201042706 A1 | 12/2010 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Appl. No. 15/019,904, filed Feb. 9, 2016, entitled "Plasma Assisted Atomic Layer Deposition Titanium Oxide for Conformal Encapsulation and Gap Fill Applications."

U.S. Appl. No. 14/552,011, filed Nov. 24, 2014, entitled "Selective Inhibition in Atomic Layer Deposition of Silicon-Containing Films."

U.S. Appl. No. 14/678,736, filed Apr. 3, 2015, entitled "Deposition of Conformal Films by Atomic Layer Deposition and Atomic Layer Etch."

U.S. Office Action dated Mar. 15, 2013 issued in U.S. Appl. No. 13/084,399.

U.S. Final Office Action dated Sep. 13, 2013 issued in U.S. Appl. No. 13/084,399.

U.S. Notice of Allowance dated Jan. 15, 2014 issued in U.S. Appl. No. 13/084,399.

U.S. Office Action dated Jan. 2, 2015 issued in U.S. Appl. No. 14/231,554.

U.S. Final Office Action dated Jun. 10, 2015 issued in U.S. Appl. No. 14/231,554.

U.S. Notice of Allowance dated Aug. 31, 2015 issued in U.S. Appl. No. 14/231,554.

U.S. Office Action dated Sep. 14, 2012 issued in U.S. Appl. No. 13/084,305.

U.S. Final Office Action dated Apr. 25, 2013 issued in U.S. Appl. No. 13/084,305.

U.S. Office Action dated Apr. 13, 2011 issued in U.S. Appl. No. 12/889,132.

U.S. Notice of Allowance dated Sep. 30, 2011 issued in U.S. Appl. No. 12/889,132.

U.S. Office Action dated Aug. 1, 2012 issued in U.S. Appl. No. 13/011,569.

U.S. Final Office Action dated Feb. 26, 2013 issued in U.S. Appl. No. 13/011,569.

U.S. Notice of Allowance dated May 6, 2013 issued in U.S. Appl. No. 13/011,569.

U.S. Office Action dated Apr. 4, 2013 issued U.S. Appl. No. 13/242,084.

U.S. Notice of Allowance dated Jun. 19, 2013 issued U.S. Appl. No. 13/242,084.

U.S. Notice of Allowance dated Sep. 19, 2013 issued U.S. Appl. No. 13/242,084.

U.S. Office Action dated Sep. 21, 2015 issued U.S. Appl. No. 14/607,997.

U.S. Final Office Action dated Mar. 18, 2016 issued U.S. Appl. No. 14/607,997.

U.S. Notice of Allowance dated Aug. 7, 2014 issued U.S. Appl. No. 14/133,239.

U.S. Notice of Allowance dated Nov. 26, 2014 issued U.S. Appl. No. 14/133,239.

U.S. Office Action dated Apr. 29, 2013 issued U.S. Appl. No. 13/224,240.

U.S. Final Office Action dated Nov. 22, 2013 issued U.S. Appl. No. 13/224,240.

(56) References Cited

OTHER PUBLICATIONS

US Examiner's Answer to Appeal Brief (filed May 22, 2014) Before the Patent Trial and Appeal Board dated Aug. 14, 2014 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in Application No. 14/074,617.
U.S. Notice of Allowance dated Nov. 20, 2015 issued in U.S. Appl. No. 14/074,617.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Notice of Allowance dated Aug. 5, 2015 issued in U.S. Appl. No. 14/183,287.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Apr. 13, 2015 issued in U.S. Appl. No. 14/335,785.
U.S. Office Action dated May 25, 2016 issued in U.S. Appl. No. 14/552,011.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
Taiwan Office Action [no translation] dated Apr. 27, 2016 issued in Application No. TW 100113041.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Taiwan Office Action [no translation] dated May 5, 2016 issued in TW 100134208.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Taiwan Notice of Allowance and Search Report dated Dec. 18, 2015 issued in Application No. TW 101134692.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Taiwan Office Action and Search Report dated Jan. 27, 2016 issued in Application No. TW 101134692.
Chinese First Office Action dated May 19, 2016 issued in CN 201310021460.8.
European Extended Search Report dated Apr. 14, 2014 issued in Application No. EP 13 15 2046.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese First Office Action dated Apr. 11, 2016 issued in Application No. CN 201510086588.1.
Japanese Office Action dated Apr. 19, 2016 issued in Application No. JP 2015-21804.
Korean Office Action dated Feb. 19, 2016, issued in Application No. KR 10-2015-0022610.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Hausmann et al. (2002) "Atomic Layer Deposition of Hafnium and Zirconium Oxides Using Metal Amide Precursors," *Chem. Mater.* 14(10):4350-4358.
Kim, H., et al. (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.

(56) References Cited

OTHER PUBLICATIONS

King, Sean W., (Jul./Aug. 2011) "Plasma enhanced atomic layer deposition of SiN$_x$:H and SiO$_2$," *J. Vac. Sci. Technol.* A29(4):041501-1 through 041501-9 (9 pages).

Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].

Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.

Lavareda et al., (2004) "Properties of a-Si:H TFTs using silicon carbonitride as dielectric," *Journal of Non-Crystalline Solids*, 338-340:797-801.

Lee et al., (2005) "Chemically conformal deposition of SrTiO$_3$ thin films by Atomic Layer Deposition using conventional metal organic precursors and remote-plasma activated H$_2$O," School of Materials Science and Engineering, and Inter-university Semiconductor Research Center, Seoul National University, *Microelectronic Engineering* 80:158-161.

Lee, Jong Ju, (2005) "Low-impurity, highly conformal atomic layer deposition of titanium nitride using NH$_3$—Ar—H$_2$ plasma treatment for capacitor electrodes," *Materials Letters*, 59:615-617.

Li, Xingcun, et al., (2011) "Atomic Layer Deposition Al$_2$O$_3$ Thin Films in Magnetized Radio Frequency Plasma Source," *Physics Procedia* 18:100-106.

Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.

Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

Puurunen, Riikka L. (2005) "Surface chemistry of atomic layer deposition: A case study for the trimethylaluminum/water process," *Journal of Applied Physics*, 97:121301-1-121301-52.

van der Straten et al. (2004) "Atomic layer deposition of tantalum nitride for ultrathin liner applications in advanced copper metallization schemes," *Journal of Materials Research*, 19(2):447-453.

U.S. Office Action dated Jul. 1, 2016 issued in U.S. Appl. No. 13/963,212.

U.S. Office Action dated Jan. 12, 2017 issued in U.S. Appl. No. 13/963,212.

U.S Final Office Action dated Jun. 28, 2017 issued in U.S. Appl. No. 13/963,212.

U.S. Notice of Allowance dated Jun. 16, 2016 issued U.S. Appl. No. 14/607,997.

U.S. Notice of Allowance dated Sep. 27, 2016 issued U.S. Appl. No. 14/607,997.

US Patent Board Decision on Appeal Before the Patent Trial and Appeal Board (Examiner Affirmed) dated Aug. 11, 2016 issued U.S. Appl. No. 13/224,240.

U.S. Notice of Allowance dated Nov. 17, 2016 issued U.S. Appl. No. 13/224,240.

U.S. Notice of Allowance (Supplemental Notice of Allowability) dated Feb. 21, 2017 issued U.S. Appl. No. 13/224,240.

U.S. Office Action dated Dec. 30, 2016 issued in U.S. Appl. No. 15/015,952.

U.S. Notice of Allowance dated Jun. 15, 2017 issued in U.S. Appl. No. 15/015,952.

U.S. Office Action dated Feb. 3, 2017 issued in U.S. Appl. No. 14/987,542.

U.S. Notice of Allowance dated Jun. 20, 2017 issued in U.S. Appl. No. 14/987,542.

U.S. Final Office Action dated Nov. 1, 2016 issued in U.S. Appl. No. 14/194,549.

U.S. Office Action dated Apr. 19, 2017 issued in U.S. Appl. No. 14/194,549.

U.S. Office Action dated Aug. 1, 2016 issued in U.S. Appl. No. 14/932,869.

U.S. Office Action dated Jun. 14, 2016 issued in U.S. Appl. No. 15/019,904.

U.S. Notice of Allowance dated Oct. 13, 2016 issued in U.S. Appl. No. 15/019,904.

U.S. Office Action dated Nov. 25, 2016 issued in U.S. Appl. No. 15/178,474.

U.S. Notice of Allowance dated Feb. 10, 2017 issued in U.S. Appl. No. 15/178,474.

U.S. Notice of Allowance dated Mar. 27, 2017 issued in U.S. Appl. No. 15/178,474.

U.S. Notice of Allowance dated Apr. 18, 2017 issued in U.S. Appl. No. 15/178,474.

U.S. Final Office Action dated Aug. 24, 2016 issued in U.S. Appl. No. 14/335,785.

U.S. Notice of Allowance dated Nov. 4, 2016 issued in U.S. Appl. No. 14/335,785.

U.S. Notice of Allowance dated Feb. 22, 2017 issued in U.S. Appl. No. 14/335,785.

U.S. Notice of Allowance dated Mar. 21, 2017 issued in U.S. Appl. No. 14/335,785.

U.S. Notice of Allowance [Corrected Notice of Allowability] dated Apr. 19, 2017 issued in U.S. Appl. No. 14/335,785.

U.S. Notice of Allowance dated Sep. 26, 2016 issued in U.S. Appl. No. 14/552,011.

U.S. Notice of Allowance dated Jul. 15, 2016 issued in U.S. Appl. No. 14/678,736.

Korean Office Action, dated Feb. 7, 2017, issued in Application No. KR 2012-7004925.

Taiwan Office Action dated Apr. 27, 2016 issued in Application No. TW 100113041.

Korean Office Action, dated May 23, 2017, issued in Application No. KR 10-2013-7010291.

Taiwan Office Action dated May 5, 2016 issued in TW 100134208.

Chinese Second Office Action dated Aug. 22, 2016 issued in Application No. CN 201280046487.6.

Japanese Office Action dated Aug. 23, 2016 issued in Application No. JP 2014-531838.

Singapore Supplementary Examination Report dated Jun. 1, 2016 issued in SG 11201400633R.

Chinese Second Office Action dated Aug. 16, 2016 issued in Application No. CN 201280053888.4.

Taiwan Office Action and Search Report dated Jan. 27, 2016 issued in Application No. TW 101131556.

Taiwan Office Action and Search Report dated Nov. 9, 2016 issued in Application No. TW 101131556.

Chinese Second Office Action dated Apr. 13, 2017 issued in CN 201310021460.8.

Japanese Office Action dated Jan. 10, 2017 issued in JP 2013-007612.

Taiwan Examination Report dated Mar. 29, 2017 issued in TW 102102054.

Chinese Second Office Action dated Feb. 6, 2017 issued in Application No. CN 201380006994.1.

Japanese Notification of Reasons for Rejection dated Jan. 10, 2017 issued in JP2014-554825.

Singapore Supplementary Examination Report dated Aug. 11, 2016 issued in SG 11201404315R.

Taiwan Office Action and Search Report dated Jul. 20, 2016 issued in Application No. TW 102102879.

Taiwan Office Action dated Oct. 25, 2016 issued in Application No. TW 102117772.

Taiwan Examination Report dated Jul. 13, 2017 issued in Application No. TW 102140721.

Taiwan Examination Report dated Jan. 11, 2017 issued in Application No. TW 102138326.

Chinese First Office Action dated Nov. 28, 2016 issued in Application No. CN 201410521390.7.

Chinese First Office Action dated May 27, 2017 issued in Application No. CN 201510091775.9.

(56) References Cited

OTHER PUBLICATIONS

Chinese Second Office Action dated Mar. 20, 2017 issued in Application No. CN 201510086588.1.
Korean Final Office Action dated Jun. 29, 2016, issued in Application No. KR 10-2015-0022610.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/199,608, filed Jun. 30, 2016, Singhal.
U.S. Appl. No. 15/609,864, filed May 31, 2017, Swaminathan et al.
U.S. Appl. No. 15/650,662, filed Jul. 14, 2017, Kang et al.
U.S. Appl. No. 15/654,186, filed Jul. 19, 2017, Kang et al.
U.S. Office Action dated Aug. 18, 2017 issued in U.S. Appl. No. 15/201,221.
U.S. Notice of Allowance dated Jun. 27, 2017 issued in U.S. Appl. No. 15/199,608.
U.S. Office Action dated Sep. 26, 2017 issued in U.S. Appl. No. 15/426,889.
U.S. Notice of Allowance dated Aug. 22, 2017 issued in U.S. Appl. No. 14/987,542.
U.S. Final Office Action dated Sep. 20, 2017 issued in U.S. Appl. No. 14/194,549.
U.S. Office Action dated Aug. 22, 2017 issued in U.S. Appl. No. 15/609,864.
U.S. Notice of Allowance dated Sep. 28, 2017 issued in U.S. Appl. No. 15/399,637.
Korean Office Action, dated Aug. 23, 2017, issued in Application No. KR 10-2017-7020548.
Taiwan Office Action [no translation] dated Oct. 19, 2017 issued in Application No. TW 105130207.
Korean First Office Action dated Oct. 31, 2017 issued in Application No. KR 10-2014-7008696.
Chinese Third Office Action dated Oct. 17, 2017 issued in Application No. CN 201310021460.8.
Taiwan Rejection Decision dated Aug. 17, 2017 issued in Application No. TW 102117772.
Japanese Office Action [no translation] dated Oct. 31, 2017 issued in Application No. JP 2013-230782.
U.S. Appl. No. 15/683,397, filed Aug. 22, 2017, Singhal et al.
U.S. Office Action dated Oct. 6, 2017 issued in U.S. Appl. No. 15/253,301.

\* cited by examiner

PLASMA ASSISTED ATOMIC LAYER DEPOSITION OF MULTI-LAYER FILMS FOR PATTERNING APPLICATIONS

CROSS REFERENCE TO RELATED APPLICATIONS

This application is a continuation-in-part of U.S. application Ser. No. 15/019,904, filed Feb. 9, 2016, and titled "PLASMA ASSISTED ATOMIC LAYER DEPOSITION TITANIUM OXIDE FOR CONFORMAL ENCAPSULATION AND GAPFILL APPLICATIONS," which is a continuation of U.S. patent application Ser. No. 14/187,145 (now U.S. Pat. No. 9,373,500), filed Feb. 21, 2014, and titled "PLASMA ASSISTED ATOMIC LAYER DEPOSITION TITANIUM OXIDE FOR CONFORMAL ENCAPSULATION AND GAPFILL APPLICATIONS," and is a continuation-in-part of U.S. application Ser. No. 14/607,997, titled "PLASMA ACTIVATED CONFORMAL DIELECTRIC FILM DEPOSITION," filed Jan. 28, 2015, which is a continuation of Ser. No. 14/133,239 (now U.S. Pat. No. 8,999,859), titled "PLASMA ACTIVATED CONFORMAL DIELECTRIC FILM DEPOSITION," filed Dec. 18, 2013, which is a divisional of U.S. application Ser. No. 13/242,084 (now U.S. Pat. No. 8,637,411), titled "PLASMA ACTIVATED CONFORMAL DIELECTRIC FILM DEPOSITION," filed Sep. 23, 2011, which is a continuation-in-part of U.S. application Ser. No. 13/084,399 (now U.S. Pat. No. 8,728,956), titled "PLASMA ACTIVATED CONFORMAL FILM DEPOSITION," filed Apr. 11, 2011, which claims the benefit of U.S. Provisional Application No. 61/324,710, filed Apr. 15, 2010, 61/372,367, filed Aug. 10, 2010, 61/379,081, filed Sep. 1, 2010, and 61/417,807, filed Nov. 29, 2010, all titled "PLASMA ACTIVATED CONFORMAL FILM DEPOSITION." U.S. application Ser. No. 15/019,904 is also a continuation-in-part of application Ser. No. 14/631,637 (now U.S. Pat. No. 9,343,296), titled "APPARATUSES AND METHODS FOR DEPOSITING SIC/SICN FILMS VIA CROSS-METATHESIS REACTIONS WITH ORGANOMETALLIC CO-REACTANTS," filed Feb. 25, 2015, which is a continuation of U.S. application Ser. No. 13/738,851 (now U.S. Pat. No. 8,993,460), titled "APPARATUSES AND METHODS FOR DEPOSITING SiC/SiCN FILMS VIA CROSS-METATHESIS REACTIONS WITH ORGANOMETALLIC CO-REACTANTS," filed Jan. 10, 2013.

This application is also a continuation-in-part of U.S. patent application Ser. No. 15/177,108, filed Jun. 8, 2016, and titled "SOFT LANDING NANOLAMINATES FOR ADVANCED PATTERNING," which is a divisional of U.S. patent application Ser. No. 14/194,324 (now U.S. Pat. No. 9,390,909), filed Feb. 28, 2014, and titled "SOFT LANDING NANOLAMINATES FOR ADVANCED PATTERNING," which is a continuation-in-part of U.S. patent application Ser. No. 14/074,617 (now U.S. Pat. No. 9,287,113), filed Nov. 7, 2013, and titled "METHODS FOR DEPOSITING FILMS ON SENSITIVE SUBSTRATES," which claims benefit of priority to U.S. Provisional Patent Application No. 61/724,217, filed Nov. 8, 2012, and titled "METHOD FOR DEPOSITING FILMS ON SENSITIVE SUBSTRATES." Each of the applications mentioned in this section is herein incorporated by reference in its entirety and for all purposes.

BACKGROUND

Fabrication of advanced integrated circuits often involve patterning of 1x nm half-pitch features in high volume manufacturing of semiconductors. Multiple patterning techniques may enable feature size scaling based on lithographic techniques such as 193 nm immersion lithography. Self-aligned double patterning is an example of a multiple patterning technique. Extensions of various multiple patterning techniques to 11 nm half pitch and below present challenges.

SUMMARY

Provided herein are methods of processing semiconductor substrates to enable deposition of high quality nanolaminate films for use in multiple patterning integration schemes.

In one aspect of the disclosed embodiments, a method of patterning a substrate is provided, the method including: providing a substrate including a core layer, where the core layer is patterned; forming a nanolaminate film on the core layer, the nanolaminate film including a stack including at least at least one layer of a first film and at least one layer of a second film, where (i) the first film and the second film have different compositions, and/or (ii) the layer of the first film and the layer of the second film are formed using different reaction conditions, where the layer of the first film has a thickness between about 0.5-50 Å, where the layer of the second film has a thickness between about 0.5-50 Å, and where the nanolaminate film has a thickness between about 50-300 Å; and etching the nanolaminate film to expose the core layer, where portions of the nanolaminate film remain on the substrate after etching.

In certain embodiments, the thickness of the layer of the first film may be between about 0.5-2 Å. In some embodiments, the stack includes at least about 50 layers of the first film interleaved with at least about 50 layers of the second film, where the thicknesses of the layers of the first film are between about 0.5-2 Å, and where the thicknesses of the layers of the second film are between about 0.5-2 Å. In some such cases, the layers of the first film and the layers of the second film are each formed through a single deposition cycle including: exposing the substrate to a first reactant in vapor phase and allowing the first reactant to adsorb onto the substrate; exposing the substrate to a second reactant in vapor phase and allowing the second reactant to adsorb onto the substrate; and exposing the substrate to plasma to drive a surface reaction between the first reactant and the second reactant. The first and second reactants used to form the layers of the first film may be different from the first and second reactants used to form the layers of the second film.

In various cases, the first film may have a different composition than the second film. In some such cases, the first film may be silicon oxide and the second film may be metal oxide. In some embodiments, the method may further include forming metal silicates at an interface between the layer of the first film and the layer of the second film. In certain implementations, the first film may include a first metal oxide and the second film may include a second metal oxide, the first and second metal oxides including different metals. In some embodiments, the first film and the second film each include silicon oxide, where the layer of the first film is deposited under different conditions than the layer of the second film. In some other embodiments, the first film and the second film each include metal oxide, where the layer of the first film is deposited under different conditions than the layer of the second film. In some implementations, the layer of the first film may be deposited under different conditions than the layer of the second film, the conditions that are different relating to one or more parameters selected from the group consisting of: identity of reactants, duration of reactant exposure, RF power, duration of RF exposure, RF frequency, substrate temperature, and pressure.

A number of different materials may be present. In some embodiments, the first film may include a metal oxide selected from the group consisting of: scandium oxide, yttrium oxide, lanthanum oxide, titanium oxide, zirconium oxide, hafnium oxide, vanadium oxide, niobium oxide, tantalum oxide, tin oxide, and manganese oxide. In certain implementations, all layers in the nanolaminate film may be deposited through atomic layer deposition or conformal film deposition mechanisms. The layer of the first film may be may be formed by exposing the substrate to a plasma generated at an RF power between about 700-1770 W/m$^2$, where each time the substrate is exposed to the plasma while forming the layer of the first film, a duration of plasma exposure is between about 0.1-0.5 seconds. In some such embodiments, during formation of the layer of the first film, the substrate may be maintained at a temperature of about 300° C. or less. The core layer may be patterned to include a plurality of raised features. After etching, the nanolaminate film may (i) be removed from areas above the raised features, and (ii) remain in sidewalls that abut the raised features. The nanolaminate film may be formed as a spacer layer while performing a double patterning scheme or a quadruple patterning scheme. In some embodiments, the method may be repeated at least once such that the nanolaminate film forms over the core layer and a second nanolaminate film forms over a second core layer, where the method is performed while performing a quadruple patterning scheme.

In a further aspect of the disclosed embodiments, an apparatus for depositing a nanolaminate film on a substrate is provided, the apparatus including: a reaction chamber; an inlet for providing gas phase reactants to the reaction chamber; an outlet for removing gas phase reactants and byproducts from the reaction chamber; a substrate support; a plasma generator; and a controller including computer executable instructions for: forming a nanolaminate film on the substrate, the nanolaminate film including a stack including at least at least one layer of a first film and at least one layer of a second film, where (i) the first film and the second film have different compositions, and/or (ii) the layer of the first film and the layer of the second film are formed using different reaction conditions, where the layer of the first film has a thickness between about 0.5-50 Å, where the layer of the second film has a thickness between about 0.5-50 Å, and where the nanolaminate film has a thickness between about 50-300 Å.

These and other features will be described below with reference to the associated drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Fabrication of semiconductor devices typically involves depositing one or more thin films in an integrated manufacturing process and may include patterning steps. Multiple patterning techniques are used to fabricate advanced integrated circuits, such as those with smaller features or higher aspect ratios, or down to 2x or 1x nm nodes. The term "1x" node means a process node between 10 nm and 19 nm and the term "2x" node means a process node between 20 nm and 29 nm. An example of multiple patterning is self-aligned double patterning, which produces double the number of features of a pattern formed by conventional lithography. As the devices become smaller, narrower half-pitch features may be attained using advanced multiple patterning techniques, such as quadruple patterning, or "quad patterning."

Figure 1:
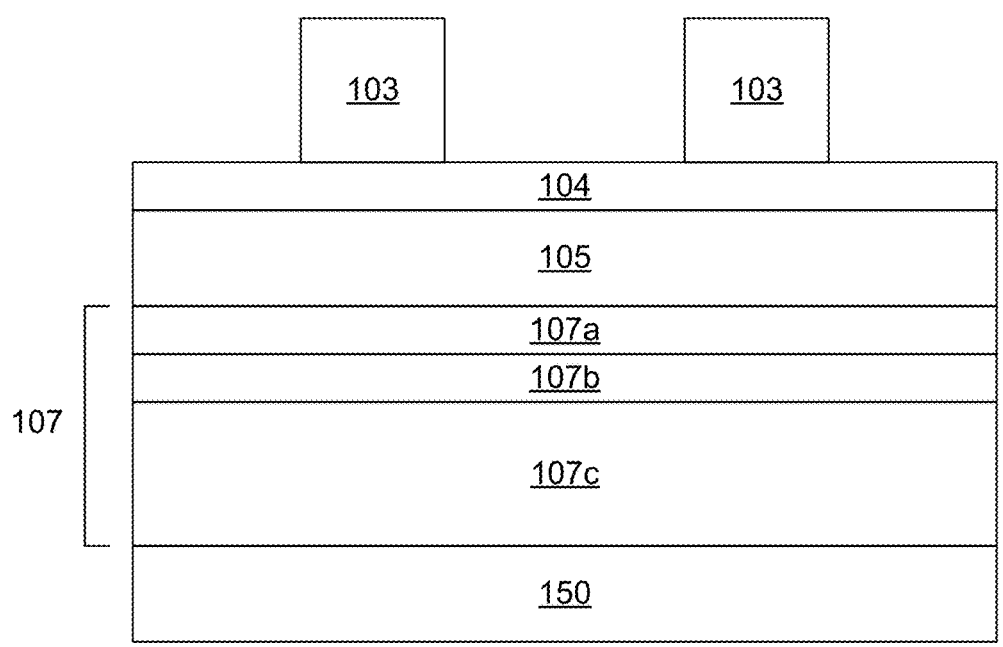
FIGS. 1-11 are schematic depictions of an integration scheme in accordance with disclosed embodiments.

An example of a quad patterning scheme is provided in FIGS. 1-11. FIG. 1 provides a schematic illustration of an example of various layers that may be included in a multi-layer stack, such as on a wafer suitable for semiconductor processing. The multi-layer stack in FIG. 1 includes a first core layer formed into first cores (also referred to as first mandrels) 103, which may be lithographically defined in a previous process, on top of a hardmask 104. Hardmask 104 may be on top of a second core layer 105, which is itself deposited on layer 107. Layer 107 may include a hardmask layer 107a, a cap layer 107b, and a mask layer 107c, which may be used as a mask to pattern a subsequent target layer 150. Barrier layers, cap layers, or etch stop layers may be between the mask layer 107c and target layer 150. One of ordinary skill in the art will appreciate that there may be one or more layers deposited between any of the above described layers, and the target layer 150 may include one or more additional layers.

The first core layer (and thus first cores 103) may be highly etch selective to other materials in the stack, such as silicon and/or silicon-based oxides or nitrides, for example, and may be transparent. The first core layer may be a photoresist or may be made of amorphous carbon material or amorphous silicon material. In some embodiments, the first core layer may be deposited on top of hardmask 104 by a deposition technique, such as plasma-enhanced chemical vapor deposition (PECVD), and the deposition technique may involve generating a plasma in the deposition chamber from deposition gases including a hydrocarbon precursor. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. Alternatively a single RF plasma source may be used. Typically such a source will be a HFRF source.

Under the first core layer formed into first cores 103 is a second core layer 105. Between the first core layer and the second core layer 105 may be a hardmask 104. The hardmask 104 may have high etch selectivity relative to first core layer and second core layer 105 so as not to etch second core layer 105 while first core layer is patterned. The second core layer 105 may be made of amorphous carbon material or amorphous silicon material. Methods of deposition and deposition precursors may be any of those described above with respect to first core layer. Once patterned, the second core layer 105 is formed into second cores (also referred to as second mandrels) 105' (shown in FIG. 5) and may be used to etch a mask in a subsequent layer, such as mask layer 107c, which may then be used to pattern the target layer 150. In certain embodiments, the mask layer 107c may be made of amorphous carbon material or amorphous silicon material. In quadruple patterning schemes, such as that depicted in FIGS. 1-11, the mask layer 107c may be the quadruple pattern of a photoresist pattern such that one feature in a photoresist is patterned and transferred to form four features in the target layer 150. Similarly, in double patterning schemes, one feature in an overlying photoresist layer is patterned and transferred to form two features in an underlying layer.

Between the second core layer 105 and target layer 150 may be other layers, such as a hardmask layer 107a, or a cap layer 107b, or a mask layer 107c to be used to pattern the target layer 150. The target layer 150 may be the layer ultimately to be patterned. The target layer 150 may be a semiconductor, dielectric or other layer and may be made of silicon (Si), silicon oxide ($SiO_2$), silicon nitride (SiN), or titanium nitride (TiN), for example. The target layer 150 may be deposited by atomic layer deposition (ALD), plasma-enhanced ALD (PEALD), chemical vapor deposition (CVD), or other suitable deposition techniques.

In one example, the compositions and thicknesses of a quad patterning stack such as the one shown in FIG. 1 may be the following: 400 Å amorphous carbon first cores 103, 150 Å silicon oxide (e.g., a tetraethylorthosilicate (TEOS) silicon dioxide or ALD silicon dioxide) hardmask layer 104, 350 Å amorphous carbon second core layer 105, 150 Å TEOS hardmask layer 107a, 100 Å amorphous silicon cap layer 107b, 300 Å amorphous carbon mask layer 107c, 200 Å titanium nitride barrier layer (not shown), and 300 Å TEOS hardmask layer (not shown), all on a silicon target layer or substrate 150. In one example, the following may be deposited on top of the 400 Å amorphous carbon first core layer in order prior to lithographic patterning to define the first core layer as depicted in the example of FIG. 1: 100 Å-150 Å SiON etch stop layer, 300 Å bottom anti-reflective coating (BARC) layer, and 1000 Å photoresist first core layer.

Figure 2:
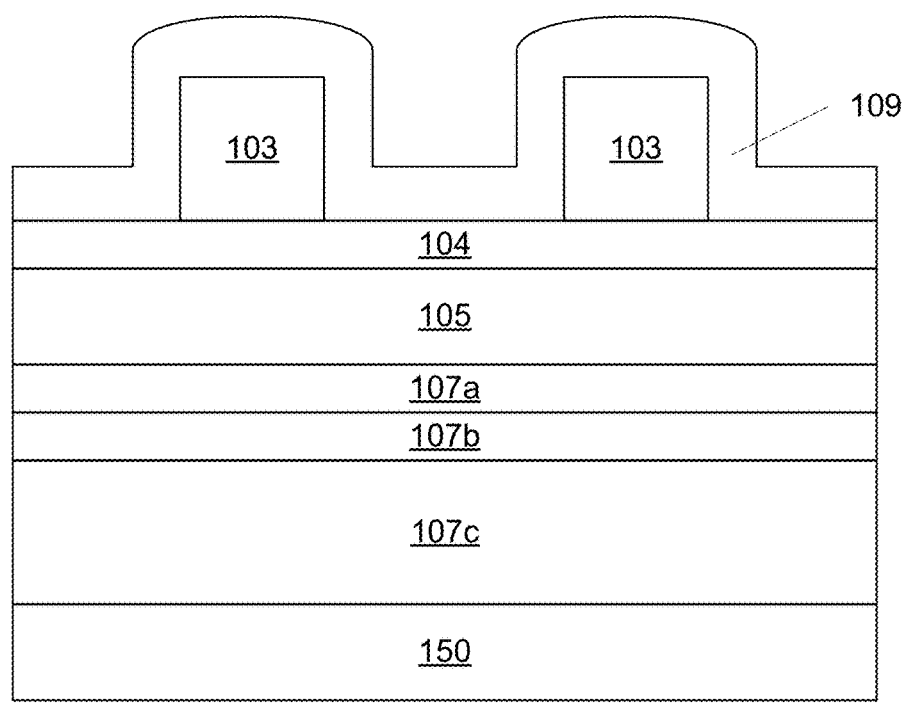

In FIG. 2, a conformal film 109 is deposited over the first cores 103. The conformal film 109 may also be referred to as a "spacer" and may be deposited to conform to the shape of the pattern on the multi-layer stack to make an evenly distributed layer over the pattern. As described further below, the conformal film 109 may be formed into multiple individual spacers, each of which abuts a sidewall of the first cores 103. The conformal film 109 has a high etch selectivity to the core. For example, the conformal film 109 may have an etch selectivity greater than 3:1 relative to an amorphous carbon layer or other material used for the first cores 103. In some embodiments, conformal film 109 has an etch selectivity greater than 15:1 relative to poly-silicon in halide etch chemistry.

The conformal film 109 may be made of dielectric material, such as $SiO_2$. The conformal film 109 may also be an oxide, such as titanium oxide ($TiO_2$), or may be silicon nitride (SiN). In some embodiments, the conformal film 109 is made of denser material to withstand more "passes" of patterning and may be deposited by ALD, PEALD, or conformal film deposition (CFD) methods as described briefly below. In certain implementations, the conformal film 109 may be a nanolaminate film that includes two or more alternating types of film. The two (or more) types of film that form the nanolaminate film may have different compositions and/or may be deposited under different deposition conditions.

ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness. In an example of a PEALD process, a plasma is initiated while the second film precursor P2 is introduced to the reactor to activate the reaction between P1 and P2.

CFD may be used to deposit the conformal film 109. Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process may be shortened or eliminated in an example CFD process. Further, in some embodiments, plasma activation of deposition reactions may result in lower deposition temperatures than thermally-activated reactions, potentially reducing the thermal budget of an integrated process. For context, a short description of CFD is provided. The concept of a CFD cycle is relevant to the discussion of various embodiments herein. As with ALD processes, generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. The cycle may include certain ancillary steps such as sweeping one or more of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface. As used herein, the term PEALD includes CFD processes.

The following conditions are examples of conditions suitable for depositing a silicon oxide conformal film 109 by a CFD process. Deposition may occur at a temperature between about 50° C. and about 400° C., at a pressure between about 0.5 Torr and about 10 Torr, and an RF power for four stations between about 100 W and 10 kW. RF activation frequency can vary from about 13.56 MHz to 40 MHz for various embodiments. For a silicon oxide conformal film 109, process gases that may be used include, as a silicon source, a silicon amide (e.g., BTBAS, BDEAS (bis-di-ethyl aminosilane) or DIPAS (di-isopropyl aminosilane), and, as an oxygen source, oxygen or nitrous oxide or carbon dioxide, separately or together, diluted with an inert carrier gas, for example argon or nitrogen. Process gas flow rates may be as follows: for (liquid) silicon precursor (e.g., BTBAS, BDEAS, and DIPAS), between about 1 sccm and 3 sccm, for example BTBAS at about 2.5 sccm; for oxygen precursor ($O_2$, $N_2O$), between about 5000 sccm and 10,000 sccm, for example $N_2O$ at 5000 sccm; and for the carrier gas (Ar or $N_2$), between about 0 sccm and 10,000 sccm, for example about 5000 sccm Ar.

Figure 3:
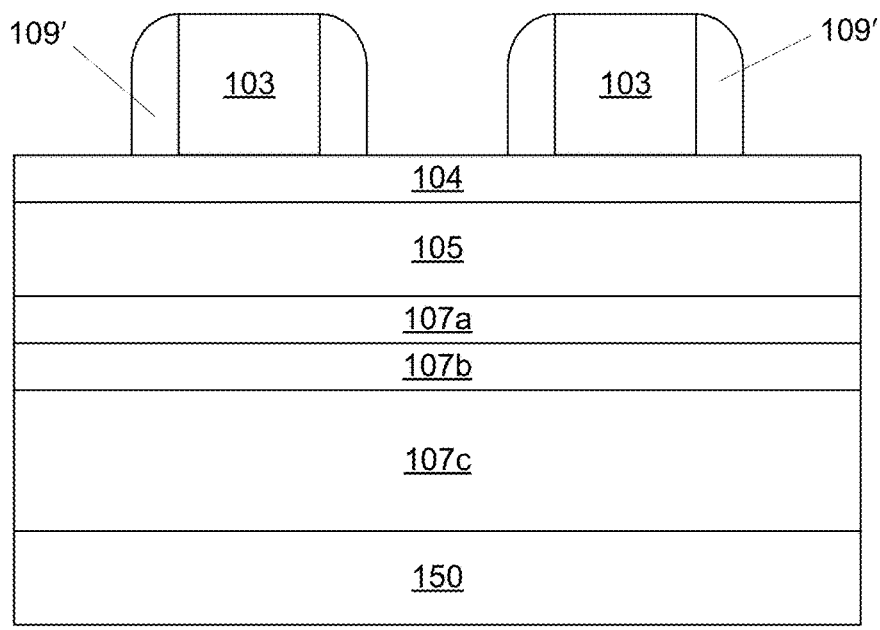

In FIG. 3, the conformal film 109 is etched back or planarized to expose the first cores 103. In various embodiments, the conformal film 109 may be planarized through a multi-step process. In one example, the conformal film 109 may be etched back by first flowing about 10 sccm to about 100 sccm of chlorine ($Cl_2$), then about 10 sccm to about 100 sccm of methane ($CH_4$), then about 10 sccm to about 100 sccm of nitrogen ($N_2$) for about 30 seconds. In some embodiments, the conformal film 109 may be etched at a temperature between about 10° C. and about 20° C. and at a pressure between about 2 mTorr and about 20 mTorr for a time of about 30 seconds. In some embodiments, the substrate may be etched at a temperature between about 40° C. and about 60° C. and at a pressure between about 5 mTorr and about 100 mTorr. In many embodiments, an anisotropic plasma etch is performed to expose the core and define the structure of the spacers 109' from the conformal film 109.

Figure 4:
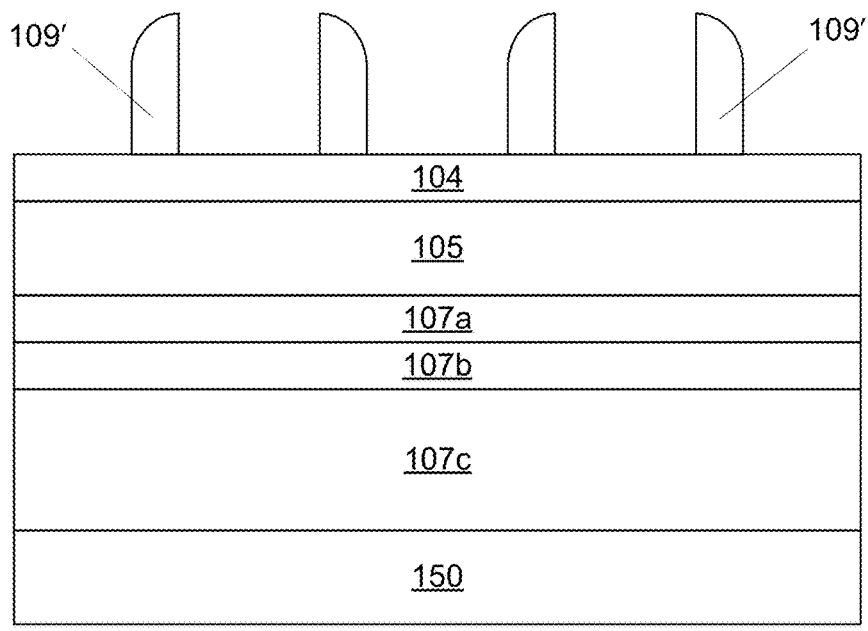

In FIG. 4, the first cores 103 are stripped or etched, leaving free-standing spacers 109' on the substrate. If the first core layer is a photoresist, the first cores 103 may be etched by flowing oxygen ($O_2$) at a flow rate between about 100 sccm and about 200 sccm at a temperature between about 40° C. and about 60° C. in a pressure between about 5 mTorr and about 20 mTorr.

If the first core layer is made of amorphous carbon material, the first cores 103 may be stripped or etched using an ashing method. An ashing method may be dependent on chemical reactions for material removal, rather than directional movement of energetic ions. For example, any surface that is exposed to the process gas used in an ashing operation may experience material removal due to the exposure, so the amorphous carbon material used in the first cores 103 may have high etch selectivity to the spacers 109' such that the spacers 109' are not etched while the first cores 103 are ashed. Additionally, in contrast to some chemical etching processes, ashing operations may produce a reaction product that is completely in the gas phase. Ashing operations for carbon films may, for example, utilize dissociated hydrogen ($H_2$) or oxygen ($O_2$) as a process gas, which may react with carbon films to form such gas-phase reaction byproducts. In some embodiments, the remaining spacers 109' may be shaped for subsequent processing using various etch conditions.

Figure 5:
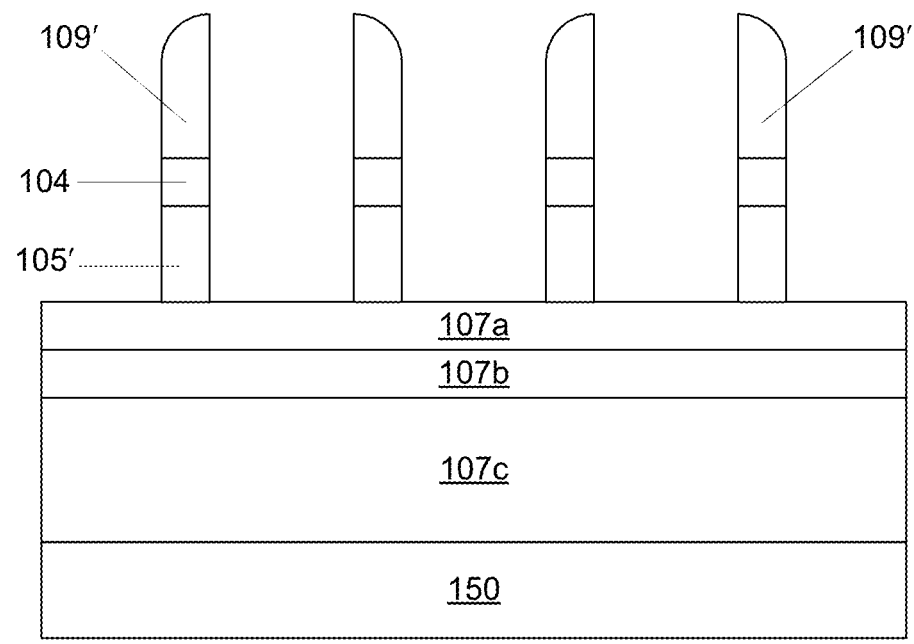

In FIG. 5, the second core layer 105 is etched down using the spacers 109' as a mask, thereby transferring the pattern to form second cores 105'. The second core layer 105 may be etched at a temperature between about 50° C. and about 70° C. in a pressure between about 5 mTorr and about 100 mTorr using chemistry suitable for etching the second core layer 105 but not the spacers 109'. The second core layer 105 is thus highly etch selective to the spacers 109'. The second core layer 105 may be an amorphous carbon layer, or amorphous silicon layer. Above the second core layer 105 may be a hardmask layer 104, which may be a silicon anti-reflective coating, or PECVD dielectric layer, or spin-on glass.

Figure 6:
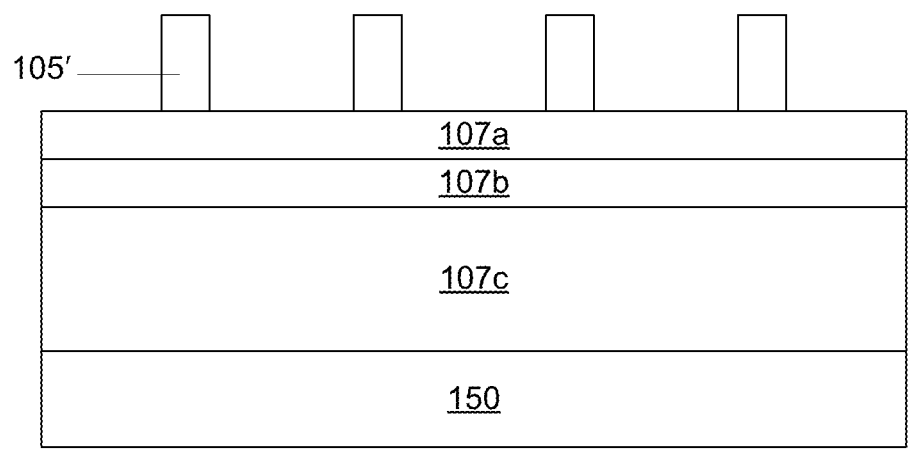

In FIG. 6, the spacers 109' and the hardmask layer 104 are etched or otherwise removed, leaving the patterned second cores 105'. In some embodiments, the spacers 109' may be removed at a temperature between about 10° C. and about 20° C. and at a pressure between about 2 mTorr and about 20 mTorr for a time of about 30 seconds. In some embodiments, the substrate may be etched at a temperature between about 40° C. and about 60° C. and at a pressure between about 5 mTorr and about 100 mTorr. In many embodiments, an anisotropic plasma etch is performed. In one example, the spacers 109' are etched by first flowing about 10 sccm to about 100 sccm of chlorine ($Cl_2$), then about 10 sccm to about 100 sccm of methane ($CH_4$), then about 10 sccm to about 100 sccm of nitrogen ($N_2$) for about 30 seconds.

Figure 7:
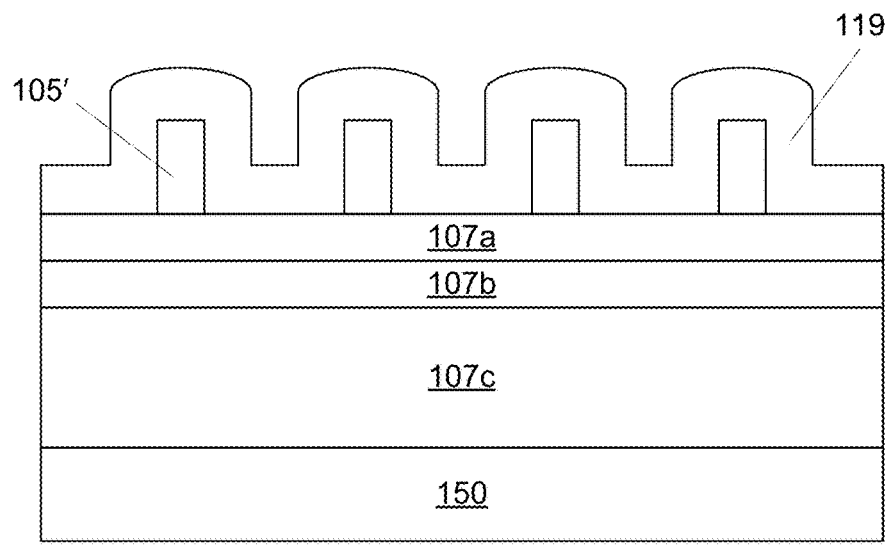

In FIG. 7, a second conformal film 119 is deposited over the patterned second cores 105'. In many embodiments, the second conformal film 119 may be a nanolaminate layer including two or more different types of film, which may be deposited by PEALD methods. The different film types may have different compositions, and/or may be deposited under different reaction conditions.

Figure 8:
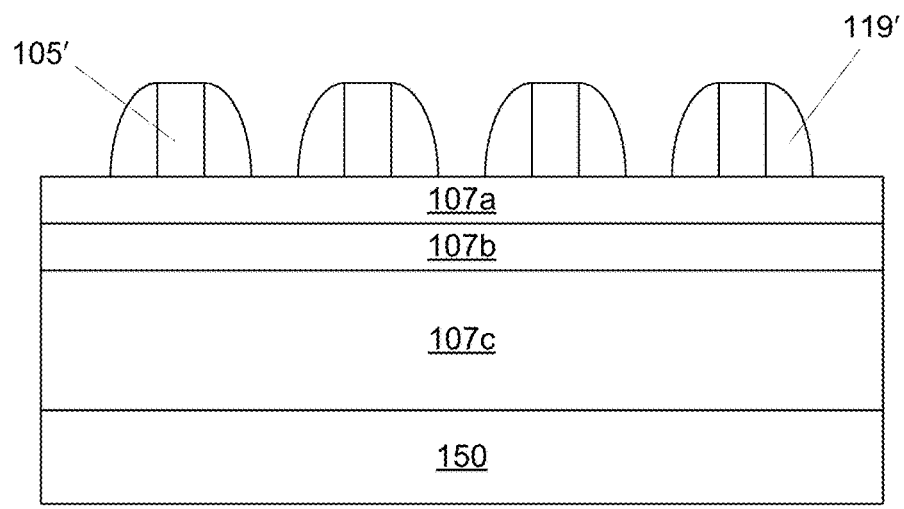

In FIG. 8, the second conformal film 119 is etched or planarized to expose the second cores 105'. Conditions and methods may be any of those discussed above with respect to FIG. 3.

Figure 9:
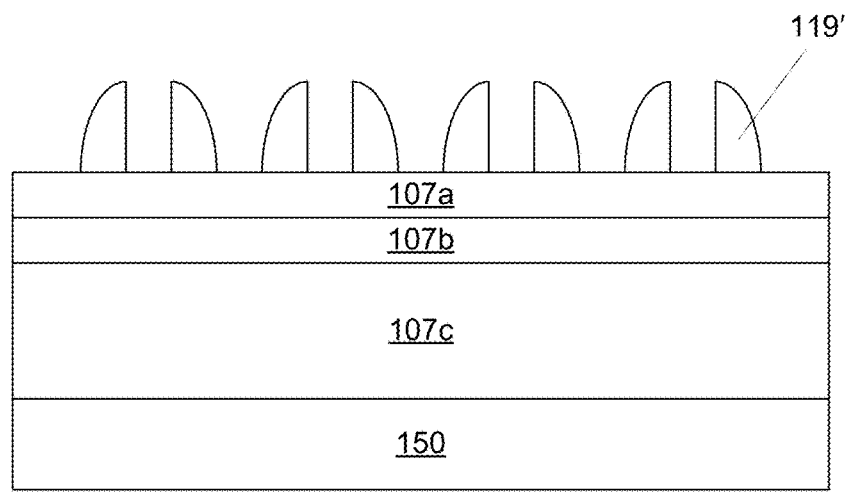

In FIG. 9, the second cores 105' are etched or removed, leaving free-standing second spacers 119'. Conditions and methods may be any of those discussed above with respect to FIG. 4.

Figure 10:
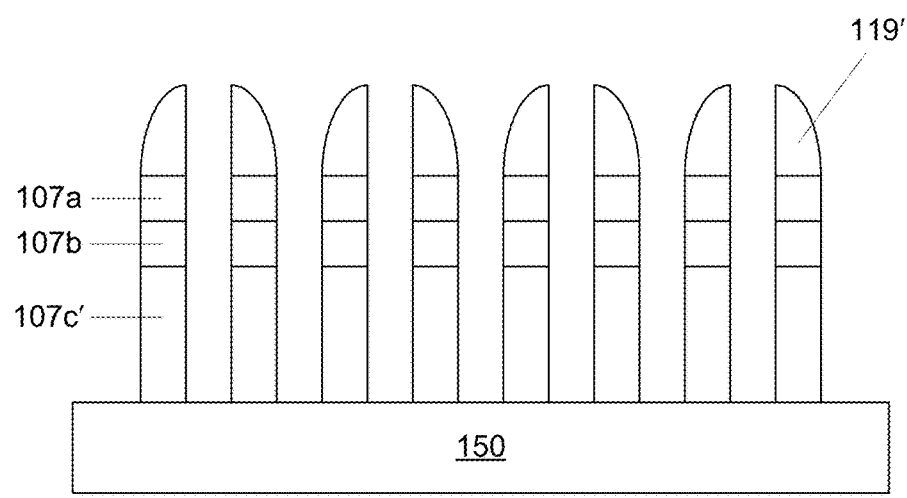

In FIG. 10, the mask layer 107c is etched down using the second spacers 119' as a mask, thereby transferring the pattern from the second spacers 119' to form a patterned mask 107c'. Mask layer 107c may be highly etch selective to the second conformal film 119, and may be etched by any method discussed above with respect to FIG. 5, depending on the chemistry of the mask layer 107c.

Figure 11:
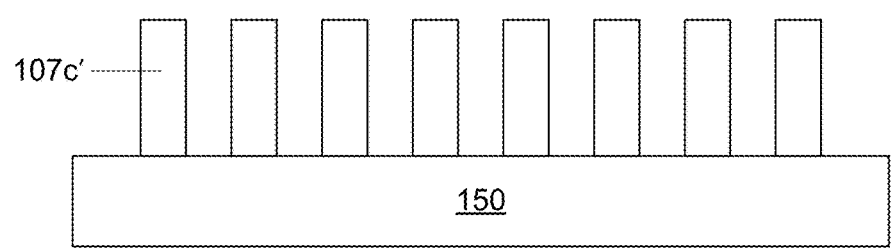

In FIG. 11, the second spacers 119' are removed, along with etch stop layer 107a and cap layer 107b, leaving the patterned mask 107c'. Conditions and methods for removing the second spacers 119' may be any of those discussed above with respect to FIG. 6. The mask 107c' may then be used to pattern subsequent layers, such as target layer 150. The result of process steps depicted in FIGS. 1 through 11 is a quad-patterning scheme such that a single lithographically defined feature (such as a first core 103 in FIG. 1) results in four smaller features on the substrate. Quad patterning schemes may be used to form features with a half-pitch as small as 10 nm, or between 10 nm and 20 nm half-pitch, which cannot be achieved by current double patterning schemes. Quad patterning schemes essentially involve performing a dual patterning scheme twice. For instance, the general process flow described in relation to FIGS. 1-6 illustrate a dual patterning scheme, sometimes referred to as self-aligned double patterning (SADP) scheme or spacer defined double patterning (SDDP) scheme.

Due to the nature of forming the smaller features, the material used for the second conformal film 119 may be of higher quality relative to conformal films used in spacers of wider cores so as to maintain robustness and prevent buckling when it is exposed to harsh conditions in subsequent patterning steps. Higher quality conformal film material may have near-ideal stoichiometry, such as if the conformal film includes titanium oxide, the higher quality titanium oxide conformal film may have near ideal Ti:O stoichiometry, for example 1:1, 2:3, or 1:2 (depending on the oxidation state of the titanium), and low carbon content. Similarly, if the conformal film includes silicon oxide, the silicon oxide film may have near ideal Si:O stoichiometry, for example 1:1 or 1:2 (depending on the oxidation state of the silicon), and a low carbon content. If the conformal film includes scandium oxide, the scandium oxide film may have near ideal Sc:O stoichiometry, for example 2:3, and a low carbon content. If the conformal film includes yttrium oxide, the yttrium oxide film may have near ideal Y:O stoichiometry, for example 2:3, and a low carbon content. If the conformal film includes lanthanum oxide, the lanthanum oxide film may have near ideal La:O stoichiometry, for example 2:3, and a low carbon content. If the conformal film includes zirconium oxide, the zirconium oxide film may have near ideal Zr:O stoichiometry, for example 1:2, and a low carbon content. If the conformal film includes hafnium oxide, the hafnium oxide film may have near ideal Hf:O stoichiometry, for example 1:2, and a low carbon content. If the conformal film includes vanadium oxide, the vanadium oxide film may have near ideal V:O stoichiometry, for example 1:1, or 2:3, or 1:2, or 2:5 (depending on the oxidation state of the vanadium), and a low carbon content. If the conformal film includes niobium oxide, the niobium oxide film may have near ideal Nb:O stoichiometry, for example 1:1, or 1:2, or 2:5 (depending on the oxidation state of the niobium), and a low carbon content. If the conformal film includes tantalum oxide, the tantalum oxide film may have near ideal Ta:O stoichiometry, for example 2:5, and a low carbon content. If the conformal film includes tin oxide, the tin oxide film may have near ideal Sn:O stoichiometry, for example 1:1, or 1:2, and a low carbon content. If the conformal film includes manganese oxide, the manganese oxide film may have near ideal Mn:O stoichiometry, for example 1:1, 3:4, or 1:2, and a low carbon content. In various embodiments, a conformal film that includes any of the materials listed herein may provide the material at substantially any of the stoichiometries listed herein with respect to that material (e.g., within ±10%). As used herein, a low carbon content film used in a nanolaminate film may have a maximum carbon content of about 10%, by weight.

High quality conformal films may be deposited by ALD, which may perform a complete conversion from the oxidation half-reaction, thereby forming near ideal stoichiometry. Thus, high quality conformal film material may have a low etch rate and high etch selectivity, and may also be infinitely selective against oxides and nitrides. These films may also have higher modulus, such as greater than about 150 MPa, which contributes to improved mechanical stability of the conformal film as a spacer, thereby improving critical dimension uniformity (CDU). The high quality conformal film materials and structures disclosed herein may also be dense to withstand subsequent integration steps.

In various embodiments, the conformal film 109 and/or the second conformal film 119 may be nanolaminate films that include two or more types of layers. Such nanolaminate films are useful as spacer materials for patterning applications as described above, especially when processing at a 5-20 nm node. The different types of layers in the nanolaminate film may have different compositions (and may each independently be any of the compositions listed herein), and/or the different types of layers may be deposited under different reaction conditions. Typically, the nanolaminate film will include at least about 2 layers, in some cases at least about 10 layers, or at least about 50 layers. In various cases, the layers in the nanolaminate film may be formed through ALD or CFD. A layer may be formed by as few as one ALD or CFD deposition cycle, in which case it may have a thickness between about 0.5-2 Å, depending on the material being deposited and the conditions used. When multiple ALD or CFD cycles are performed under the same conditions to deposit the same material, the resulting layer is thicker. In some cases, the maximum thickness of each layer in the nanolaminate film may be about 50 Å, which may be formed by between about 25-80 ALD or CFD cycles, depending on the material being deposited and the conditions used. The nanolaminate film may have a maximum of about 400 layers (e.g., 400 layers each at about 0.5 Å thick for a 200 Å thick nanolaminate layer). In some cases the maximum number of layers in the nanolaminate film is smaller, for example about 300, or 200, or 100, or 50.

Nanolaminate films provide particular benefits when used as spacer materials in advanced patterning schemes (e.g., self-aligned double patterning and quadruple patterning as described in relation to FIGS. 1-11). For instance, nanolaminate films can be tailored to have particular etch rates. A nanolaminate film made of alternating layers of different types of materials may have an intermediate etch rate that is between the etch rates of the individual materials making up the nanolaminate film. In some cases, a nanolaminate film made of alternating layers of different types of materials may have an etch rate that falls outside of (e.g., below or above) the etch rates of the individual materials that make up the nanolaminate film. The etch rate of the nanolaminate film can be easily tailored by controlling the relative thicknesses of each of the different types of layers. The target etch rate of the nanolaminate film will depend on the materials used to form the nanolaminate film, the chemistry and conditions used to etch the film, and the material used to form the underlying core layers. Different combinations of materials and conditions will result in different optimal etch rates. Thus, it is beneficial to be able to control and tune the etch rate of the nanolaminate film, as described, in order to achieve a desired level of selectivity between the nanolaminate film and other materials that are exposed during an etching process.

Further, the use of nanolaminate films can promote formation of desired bonding structures/stoichiometries/materials, resulting in very high quality stoichiometric films. Often, such films are relatively dense, and may be provided at a substantially ideal stoichiometry, as indicated above. In one example, a nanolaminate film includes alternating layers of silicon oxide (e.g., $SiO_2$) and titanium oxide (e.g., $TiO_2$), with titanium silicate forming at the interfaces between these layers. The titanium silicate may remain at the interfaces between the layers, or it may be diffused or otherwise integrated into the thickness of the layers of the nanolaminate film. In a similar example, a nanolaminate film includes alternating layers of silicon oxide (e.g., $SiO_2$) and hafnium oxide (e.g., $HfO_2$), with hafnium silicate forming at the interfaces between these layers. The hafnium silicate may remain at the interfaces between the layers, or it may be diffused or otherwise integrated into the thickness of the layers of the nanolaminate film. Other metal silicates may form when the nanolaminate film includes alternating layers of silicon oxide and other metal oxides. Certain metal silicates (including, but not limited to, titanium silicates) may exhibit novel bonding properties, which may result in a non-linear relationship between their enthalpy of bond formation vs. their resulting dry etch rates. Typically, a high enthalpy of formation correlates with stability and resistance to etching. This feature may render such materials (e.g., metal silicates) particularly useful in a nanolaminate film provided as a spacer in a patterning application.

The nanolaminate films described herein may have other features that make such films especially useful as spacer materials in advanced patterning applications (e.g., double and quadruple patterning processes). In some embodiments, the nanolaminate film may substantially stable to (e.g., non-reactive with) wet cleaning chemistry. This feature allows the substrate to be exposed to wet cleaning processes that may be used to clean/prepare a substrate at different times during fabrication. The nanolaminate film may have a modulus of at least about 170 MPa. Materials having a lower modulus may not be capable of withstanding the processing conditions without breaking away or otherwise degrading. One or more materials in the nanolaminate film (in some cases all the materials in the nanolaminate film) may be formed without using halide-containing precursors. Some such halide-free precursors may be liquid. One or more materials in the nanolaminate film (in some cases all the materials in the nanolaminate film) may be formed at a temperature that is about 400° C. or below, in some cases about 300° C. or below, or about 200° C. or below. Each layer within the nanolaminate film, as well as the entire nanolaminate film, may have a low degree of thickness non-uniformity, e.g., about 1% or lower (½ range thickness non-uniformity). ½ range thickness non-uniformity is calculated as (maximum thickness−minimum thickness)/(2*mean thickness). Each layer within the nanolaminate film, as well as the entire nanolaminate film, may have step coverage of at least about 95%. Each layer within the nanolaminate film, as well as the entire nanolaminate film, may have a relatively low degree of pattern loading, for example about 3% or less. In some embodiments, one or more layers within the nanolaminate film, in some cases all the layers within the nanolaminate film, may exhibit a low wet etch rate in a particular chemistry, compared to another material. For instance, one or more of the layers may have a wet etch rate ratio of about 0.1 or less, as compared to thermally grown silicon oxide, when etched in a solution of dilute HF (100:1 water:HF). The entire nanolaminate film may exhibit this wet etch rate ratio in some embodiments.

In certain implementations, a nanolaminate film may include alternating layers of two or more materials selected from the group consisting of: scandium oxide, yttrium oxide, lanthanum oxide, titanium oxide, zirconium oxide, hafnium oxide, vanadium oxide, niobium oxide, tantalum oxide, tin oxide, manganese oxide, and silicon oxide. In some such embodiments, the nanolaminate film may include alternating layers of silicon oxide and one or more materials selected from the group consisting of: scandium oxide, yttrium oxide, lanthanum oxide, titanium oxide, zirconium oxide, hafnium oxide, vanadium oxide, niobium oxide, tantalum oxide, tin oxide, and manganese oxide. In some other embodiments, the nanolaminate film may include alternating layers of two or more types of silicon oxide, or two or more types of scandium oxide, or two or more types of yttrium oxide, or two or more types of lanthanum oxide, or two or more types of titanium oxide, or two or more types of zirconium oxide, or two or more types of hafnium oxide, or two or more types of vanadium oxide, or two or more types of niobium oxide, or two or more types of tantalum oxide, or two or more types of tin oxide, or two or more types of manganese oxide. At least one material in the nanolaminate film may be an oxide of a group 3, group 4, or group 5 metal. In a number of embodiments, at least one material in the nanolaminate film is silicon oxide (e.g., $SiO_2$).

In certain embodiments, the nanolaminate film may be made of at least one type of layer that is deposited under relatively gentle conditions, sometimes referred to as soft landing conditions. Such conditions may relate to the use of relatively low RF power, and/or relatively low RF exposure time, and/or relatively low substrate temperature, and/or relatively gentle oxidants (e.g., $N_2O$, $CO_2$, oxygen-containing hydrocarbons, etc.). The soft landing conditions may prevent damage to the underlying materials that may otherwise be experienced at relatively harsher conditions. In some embodiments, the first film deposited to form a nanolaminate film may be deposited under soft landing conditions as described herein. Such conditions may also be used for other layers in the nanolaminate film, or not.

Figure 12A:
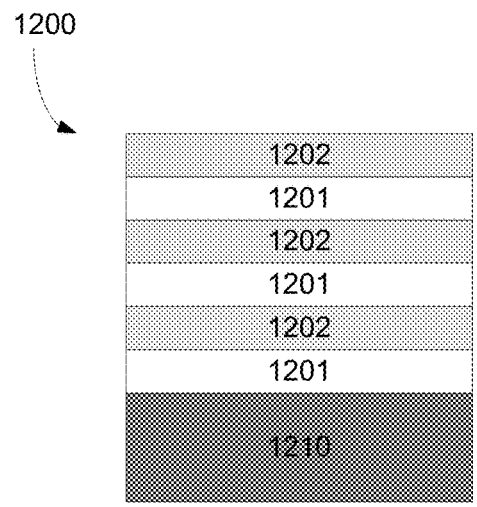
FIGS. 12A-12C illustrate substrates that have nanolaminate films formed thereon in accordance with certain embodiments.

In one example shown in FIG. 12A, a nanolaminate film 1200 includes two alternating types of film: film A 1201 and film B 1202. Film A and film B may be different materials (e.g., silicon oxide and titanium oxide or another metal oxide described herein), or they may be the same material deposited at different deposition conditions (e.g., titanium oxide deposited under soft landing conditions and titanium oxide deposited under relatively harsher, more conventional conditions). The first layer of film A may be formed before the first layer of film B, and may or may not be deposited under soft landing conditions. In another example shown in FIG. 12B, a nanolaminate film 1200' includes three types of film: film A 1201, film B 1202, and film C 1203. In order of deposition, the nanolaminate film may include film A, film B, film C, film A, film B, film C, etc. Film A may or may not be deposited under soft landing conditions. In another embodiment shown in FIG. 12C, a nanolaminate film 1200" may be deposited in the following order: film A, film B, film C, film B, film C, film B, film C, etc. Film A may or may not be deposited under soft landing conditions. In this example, film A only appears once, and the remaining portion of the nanolaminate film is formed from alternating layers of film B and film C. Additional types of film layers may be provided, either periodically or non-periodically, when forming the nanolaminate film.

Figure 12B:
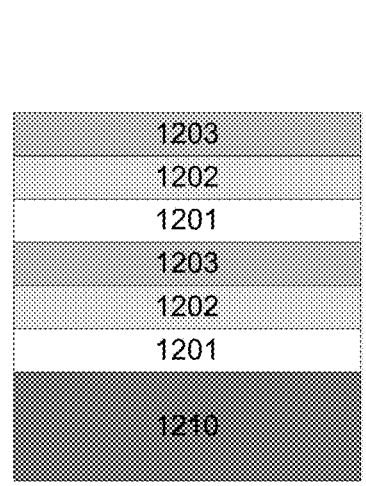
Figure 12C:
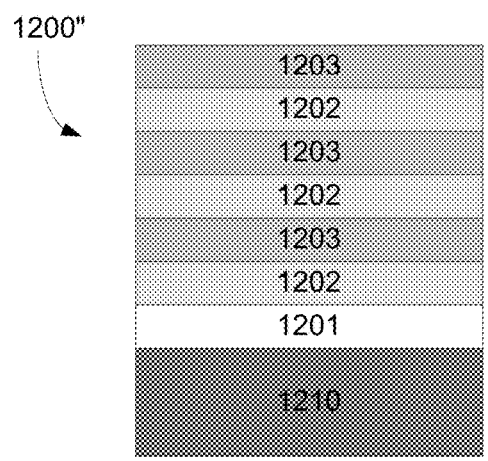

While FIGS. 12A-12C illustrate each of the layers 1201-1203 as having a uniform thickness, this is not always the case. Within the nanolaminate film, the thickness of the individual layers may be uniform or non-uniform. In some cases, a first film type has a larger average thickness and a second film type has a smaller average thickness. The thicknesses may vary by a factor of at least about 1.5 when considering the different film types. In some embodiments, some layers of a particular film type may be provided at a different thickness than other layers of that same film type within the nanolaminate film. In certain implementations, the first layer deposited in the nanolaminate film may have a thickness of at least about 0.5 Å, in some cases at least about 5 Å, or at least about 10 Å. This layer may have a maximum thickness of about 50 Å in some cases. This first layer may or may not be deposited under soft landing conditions. In some embodiments where the first layer is deposited under soft landing conditions, it may have a thickness that is sufficient to protect the underlying materials during subsequent deposition steps (which may expose the substrate to higher RF power, for longer times, at higher temperatures, using harsher oxidants, or some combination of the forgoing features). If the first layer of the nanolaminate film is not sufficiently thick in some embodiments, the underlying materials may become oxidized during later processing steps. Further, the first layer of the nanolaminate film (and in some cases, all layers of the nanolaminate film) may be deposited to a thickness that is sufficient to form a coalescent layer that does not have pinholes or other forms of incomplete coverage. The thicknesses provided herein are generally considered appropriate.

In one embodiment with reference to FIG. 12A, film A 1201 may be silicon oxide and film B 1202 may be titanium oxide or another metal oxide described herein. In a similar embodiment, these layers are reversed such that film A 1201 is titanium oxide or another metal oxide described herein, and film B 1202 is silicon oxide. In another embodiment, film A 1201 is a first type of silicon oxide and film B 1202 is a second type of silicon oxide that is deposited under different conditions than film A. In another embodiment, film A 1201 is a metal oxide (e.g., titanium oxide or another metal oxide described herein) and film B 1202 is the same metal oxide (e.g., titanium oxide or another metal oxide described herein, where film A and film B include the same metal) deposited under different conditions than film A.

In various embodiment with reference to FIG. 12B, film A 1201, film B 1202, and film C 1203 may each, independently, be any of the oxides described herein. In one embodiment, film A 1201 is silicon oxide, film B 1202 is a first metal oxide, and film C 1203 is a second metal oxide. The first metal oxide may include a different metal than the second metal oxide. In some other cases, the first metal oxide and second metal oxide may be the same metal oxide (e.g., both may be titanium oxide or another metal oxide described herein), but deposited under different conditions. The position of the layers may be switched as desired for a particular application (e.g., the silicon oxide film may be provided as film B 1202 or film C 1203). In another embodiment, at least two of the layers in the nanolaminate film 1200' of FIG. 12B include silicon. For instance, film A 1201 may be a first type of silicon oxide, film B 1202 may be a second type of silicon oxide deposited under different conditions than the first type of silicon oxide, and film C 1203 may be a third type of silicon oxide (deposited under different conditions than the first and second silicon oxides), or it may be a metal oxide. As noted above, the relative positions of the different layers in the nanolaminate film 1200' may be switched as desired for a particular application.

In various embodiments with reference to FIG. 12C, film A 1201 may be silicon oxide or a metal oxide (e.g., titanium oxide or another metal oxide described herein). In one embodiment, all of the layers in the nanolaminate film 1200" of FIG. 12C include silicon. In this example, film A 1201 may be a first type of silicon oxide, film B 1202 may be a second type of silicon oxide, and film C 1203 may be a third type of silicon oxide, where the first, second, and third types of silicon oxide are each formed under different deposition conditions. In another embodiment, at least one of the layers in the nanolaminate film 1200" of FIG. 12C includes a metal oxide. In one example, film A 1201 is silicon oxide, film B 1202 is titanium oxide (or another metal oxide described herein), and film C 1203 is silicon oxide that is formed under different conditions than film A 1201 (films B and C may also be reversed). In another example, film A 1201 is silicon oxide, film B 1202 is titanium oxide (or another metal oxide described herein), and film C 1203 is a metal oxide (e.g., hafnium oxide or another metal oxide described herein) that includes a different metal than film B 1202. In similar embodiments, film A 1201 may be a metal oxide instead of silicon oxide. Many configurations are possible and are considered to be within the scope of the present embodiments.

Figure 13:
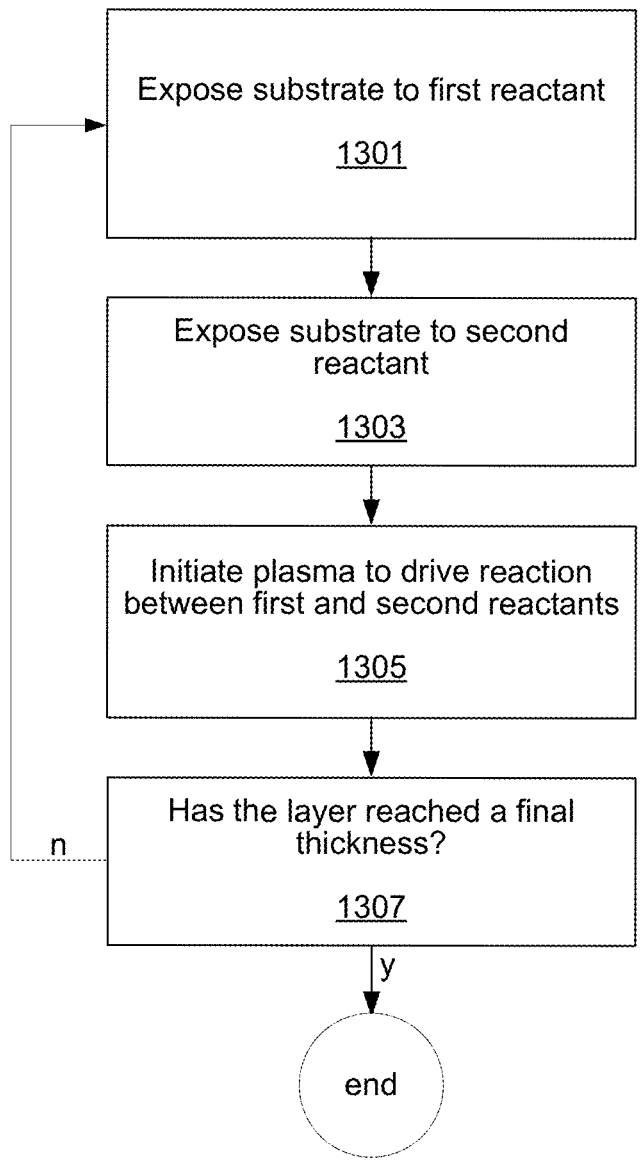
FIG. 13 presents a flow chart for a method of depositing a film on a substrate according to certain embodiments.

Each layer in the nanolaminate film may be formed by ALD or CFD. FIG. 13 provides a flow chart for a method of forming a layer in the nanolaminate film. Cycle and exposure times described herein may depend on the apparatus and platform used and one of ordinary skill in the art may adjust cycle and exposure times accordingly. In operation 1301, a substrate may be exposed to a first precursor, such as a metal-containing precursor or silicon-containing precursor. In various cases, the metal in the metal-containing precursor may be selected from the group consisting of scandium, yttrium, lanthanum, titanium, zirconium, hafnium, vanadium, niobium, tantalum, tin, and manganese. Particular reactants are discussed further below. In some embodiments, the substrate includes a core layer. In various embodiments, the core layer is amorphous carbon, amorphous silicon, or a photoresist. In some embodiments, the core layer is lithographically defined or patterned. In a certain embodiment, the substrate includes a patterned amorphous carbon layer.

After operation 1301, the deposition chamber may be purged in a sweep phase with an injector purge or a pump away step. Generally, a sweep phase removes or purges one of the vapor phase reactant from a reaction chamber and typically occurs only after delivery of such reactant is completed. In other words, that reactant is no longer delivered to the reaction chamber during the sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction by-products) from the substrate surface. In ALD, the sweep phase has been used to prevent gas phase interaction of two reactants or interaction of one reactant with a thermal, plasma or other driving force for the surface reaction. In general, and unless otherwise specified herein, a sweep/purge phase may be accomplished by (i) evacuating a reaction chamber, and/or (ii) flowing gas not containing the species to be swept out through the reaction chamber. In the case of (ii), such gas may be, for example, an inert gas.

In operation 1303, the substrate may be exposed to a second precursor, which may be an oxidant. In some embodiments, the oxidant is nitrous oxide ($N_2O$) or oxygen ($O_2$) or carbon dioxide ($CO_2$) or a mixture or combinations thereof. In some embodiments, the oxidizer may be a mixture of oxygen ($O_2$) and a weak oxidizer such as $N_2O$, $CO$, $CO_2$, $NO$, $NO_2$, $SO$, $SO_2$, $C_xH_yO_z$ and/or $H_2O$. In other implementations, the oxidation reactant may be entirely a weak oxidizer. Alternatively, the oxidation reactant may include $O_3$. In some embodiments, the oxidation reactant is about 0-50% $O_2$ and about 50-100% weak oxidizer.

In some cases, one of the reactants may be delivered continuously (e.g., even during delivery of other reactants and/or during plasma exposure). For example, an oxidizing reactant may be delivered continuously. The continuously flowing reactant may be delivered to the reaction chamber in conjunction with a carrier gas such as argon. In some cases, the delivery of the continuously flowing reactants to reaction chamber is controlled by using divert valve/inlet valve toggling. Gas flow changes may be diverted or co-flowed. In one example, a continuously flowing reactant is periodically diverted from the reaction chamber such that it is only delivered to the reaction chamber at certain periods. The continuously flowing gas may be diverted to an outlet/dump using appropriate valves. For instance, an oxidizing reactant may flow continuously, but only be delivered to the reaction chamber periodically. When the oxidizing reactant is not being delivered to the reaction chamber, it may be diverted to an outlet, recycle system, etc.

In operation 1305, a plasma may be initiated to drive a reaction between the first and second reactants. After operation 1905, the deposition chamber may be purged again. At operation 1307, it is determined whether the layer has reached a final thickness. If not, operations 1301-1305 may be repeated until the desired thickness of the layer is deposited.

As mentioned above, in certain embodiments one or more of the layers in the nanolaminate film may be deposited under soft landing conditions, which may involve relatively lower power RF, relatively shorter RF exposure, relatively lower substrate temperature, and/or relatively gentle oxidants. One or more layers in the nanolaminate film may also be deposited under more conventional deposition conditions, which may involve relatively higher power RF, relatively longer RF exposure, relatively higher substrate temperature, and/or relatively harsher oxidants. Example deposition conditions are provided.

In some embodiments where the nanolaminate film includes one or more layers of silicon oxide, the following conditions may be used to deposit the silicon oxide. The substrate temperature may be maintained between about 50-500° C. The pressure in the reaction chamber may be maintained between about 1-10 Torr, in some cases between about 2-4 Torr. The first reactant may flow into the reaction chamber for a duration between about 0.1-5 seconds (0.1-1 seconds in some cases), at a rate between about 0.5-3 mL/min or 100-500 sccm, as measured before the first reactant is vaporized (if applicable). After delivery of the first reactant (and/or after the substrate is exposed to plasma), the reaction chamber may be purged, for example using a sweep gas provided at a rate of about 5-60 SLM for a duration between about 0.1-25 seconds. The second reactant may be delivered in a dose having a duration between about 0.1-5 seconds, or between about 0.1-1 seconds in some embodiments. In other embodiments, the second reactant may be delivered continuously. The RF used to generate the plasma may be provided with a high frequency (HF) component and/or a low frequency (LF) component. In certain cases, only HF frequency is provided. The plasma may be generated at an RF power between about 50-2500 W/station, which may correspond to a power density between about 700-35,370 W/m$^2$, where the m$^2$ relates to the surface area of the substrate. During each ALD or CFD cycle, the substrate may be exposed to the plasma for a duration between about 0.1-5 seconds. RF activation may include 13.56 or 27 MHz.

In some embodiments where the nanolaminate film includes one or more layers of metal oxide, the deposition conditions may be the same as those described in relation to silicon oxide. In some cases, the deposition conditions may vary from those described in relation to silicon oxide. For example, in some such embodiments, wafer process temperature may range from about 25-400° C. Oxidative plasma may include $O_2$, $N_2O$, $CO$, $CO_2$, and combinations thereof. Inert or carrier gases may include $N_2$, $O_2$, Ar, and combinations thereof. Plasma activation may be inductively coupled or capacitively coupled. Plasma frequency may include 13.56 MHz, 27 MHz or 52 MHz, for instance.

In certain embodiments where silicon oxide is deposited under soft landing conditions, the following deposition conditions may be used. The substrate may be maintained at a temperature of about 300° C. or less, for example about 250° C. or less. In some cases, the substrate may be maintained at a temperature between about 50-300° C., or between about 50-250° C., or between about 50-150° C. In one example, the RF may be exposed to the substrate at a power level that is about 125 W/station or less, in some cases between about 50-125 W/station. This may correspond to a power density between about 700-1770 W/m$^2$, where the m$^2$ relates to the surface area of the substrate. During each ALD or CFD cycle, the substrate may be exposed to plasma for a duration of about 0.5 seconds or less, in some cases between about 0.1-0.5 seconds. Other deposition conditions may be the same as those described above.

In certain embodiments where metal oxide is deposited under soft landing conditions, the deposition conditions may be the same as those described above for depositing silicon oxide under soft landing conditions. In some embodiments where metal oxide is deposited under soft landing conditions, the deposition conditions may vary from those described in relation to silicon oxide deposited under soft landing conditions.

Any reactants may be used, as known by those of ordinary skill in the art. Certain example reactants are provided. A silicon-containing precursor may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butyl silane, allylsilane, sec-butyl silane, thexylsilane, isoamylsilane, t-butyldisilane, di-t-butyldisilane, tetra-ethyl-orthosilicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethyl silane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$).

Examples of titanium-containing precursors include tetrakis(dimethylamido)titanium (TDMAT), tetrakis(diethylamido)titanium, tetrakis(ethylmethylamido)titanium, titanium diisopropoxidebis(2,2,6,6-tetramethyl-3,5- heptanedionate), tetramethoxytitanium, tetraethoxytitanium, titanium isopropoxide, titanium tetraisopropoxide, and titanium tetrachloride.

Examples of yttrium-containing precursors include tris[N,N-bis(trimethylsilyl)amide]yttrium, tris(butylcyclopentadienyl)yttrium(III), tris(cyclopentadienyl)yttrium(III), yttrium 2-methoxyethoxide, yttrium(III) tris(isopropoxide), yttrium (III) tris(2,2,6,6-tetramethyl-3, 5-heptanedionate), and tris (methylcyclopentadienyl)yttrium Examples of lanthanum-containing precursors include lanthanum(III) isopropoxide, tris[N,N-bis(trimethylsilyl) amide]lanthanum(III), tris(cyclopentadienyl)lanthanum (III), and tris(tetramethylcyclopentadienyl)lanthanum(III).

Examples of zirconium-containing precursors include bis (cyclopentadienyl)zirconium(IV) dihydride, bis(methyl-$\eta^5$-cyclopentadienyl)methoxymethylzirconium, Dimethylbis (pentamethylcyclopentadienyl)zirconium(IV), tetrakis (diethylamido)zirconium(IV), tetrakis(dimethylamido) zirconium(IV), tetrakis(ethylmethylamido)zirconium(IV), zirconium(IV) dibutoxide(bis-2,4-pentanedionate), zirconium(IV) 2-ethylhexanoate, and zirconium tetrakis(2,2,6,6-tetramethyl-3,5-heptanedionate).

Examples of hafnium-containing precursors include bis (tert-butylcyclopentadienyl)dimethylhafnium(IV), bis (methyl-$\eta^5$-cyclopentadienyl)dimethylhafnium, bis(methyl-$\eta^5$-cyclopentadienyl)methoxymethylhafnium, bis (trimethylsilyl)amidohafnium(IV) chloride, dimethylbis (cyclopentadienyl)hafnium(IV), hafnium(IV) tert-butoxide, hafnium isopropoxide isopropanol adduct, tetrakis(diethylamido)hafnium(IV), tetrakis(dimethylamido)hafnium(IV), and tetrakis(ethylmethylamido)hafnium(IV), Examples of vanadium-containing precursors include bis (cyclopentadienyl)vanadium(II) and vanadium(V) oxytriisopropoxide. An example niobium-containing precursor is bis(cyclopentadienyl)niobium(IV) dichloride. Examples of tantalum-containing precursors include pentakis(dimethylamino)tantalum(V), tantalum(V) ethoxide, tris(diethylamido)(tert-butylimido)tantalum(V), and tris(ethylmethylamido)(tert-butylimido)tantalum(V).

Examples of tin-containing precursors include bis[bis (trimethylsilyl)amino]tin(II), dibutyldiphenyltin, hexaphenylditin(IV), tetraallyltin, tetrakis(diethylamido)tin(IV), tetrakis(dimethylamido)tin(IV), tetramethyltin, tetravinyltin, tin(II) acetylacetonate, tricyclohexyltin hydride, trimethyl (phenylethynyl)tin, and trimethyl(phenyl)tin.

Examples of manganese-containing precursors include bis(pentamethylcyclopentadienyl)manganese(II), bis(tetramethylcyclopentadienyl)manganese(II), bromopentacarbonylmanganese(I), cyclopentadienylmanganese(I) tricarbonyl, ethylcyclopentadienylmanganese(I) tricarbonyl, and manganese(0) carbonyl.

Examples of oxygen-containing precursors include carbon dioxide ($CO_2$), carbon monoxide (CO), nitric oxide (NO), nitrous oxide ($N_2O$), nitrogen dioxide ($NO_2$), oxygen ($O_2$), ozone ($O_3$), sulfur oxide (SO), sulfur dioxide ($SO_2$), oxygen-containing hydrocarbons ($C_xH_yO_z$), water ($H_2O$), hydrogen peroxide ($H_2O_2$), alkyl alcohols (e.g., methanol, ethanol, etc.), mixtures thereof, etc.

In certain embodiments, the nanolaminate film may have a low wet etch rate and a high dry etch selectivity with infinite selectivity against oxides such as silicon oxide ($SiO_2$) and nitrides such as silicon nitride (SiN). For example, the nanolaminate film may have an etch selectivity greater than 3:1 relative to an amorphous carbon layer. In some embodiments, the nanolaminate film has an etch selectivity greater than 15:1 relative to a poly silicon layer in halide etch chemistry.

Apparatus

Deposition techniques provided herein may be implemented in a plasma enhanced chemical vapor deposition (PECVD) reactor or a conformal film deposition (CFD) reactor. Such a reactor may take many forms, and may be part of an apparatus that includes one or more chambers or "reactors" (sometimes including multiple stations) that may each house one or more wafers and may be configured to perform various wafer processing operations. The one or more chambers may maintain the wafer in a defined position or positions (with or without motion within that position, e.g., rotation, vibration, or other agitation). In one implementation, a wafer undergoing film deposition may be transferred from one station to another within a reactor chamber during the process. In other implementations, the wafer may be transferred from chamber to chamber within the apparatus to perform different operations, such as etching operations or lithography operations. The full film deposition may occur entirely at a single station or any fraction of the total film thickness for any deposition step. While in process, each wafer may be held in place by a pedestal, wafer chuck, and/or other wafer-holding apparatus. For certain operations in which the wafer is to be heated, the apparatus may include a heater, such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

Figure 14:
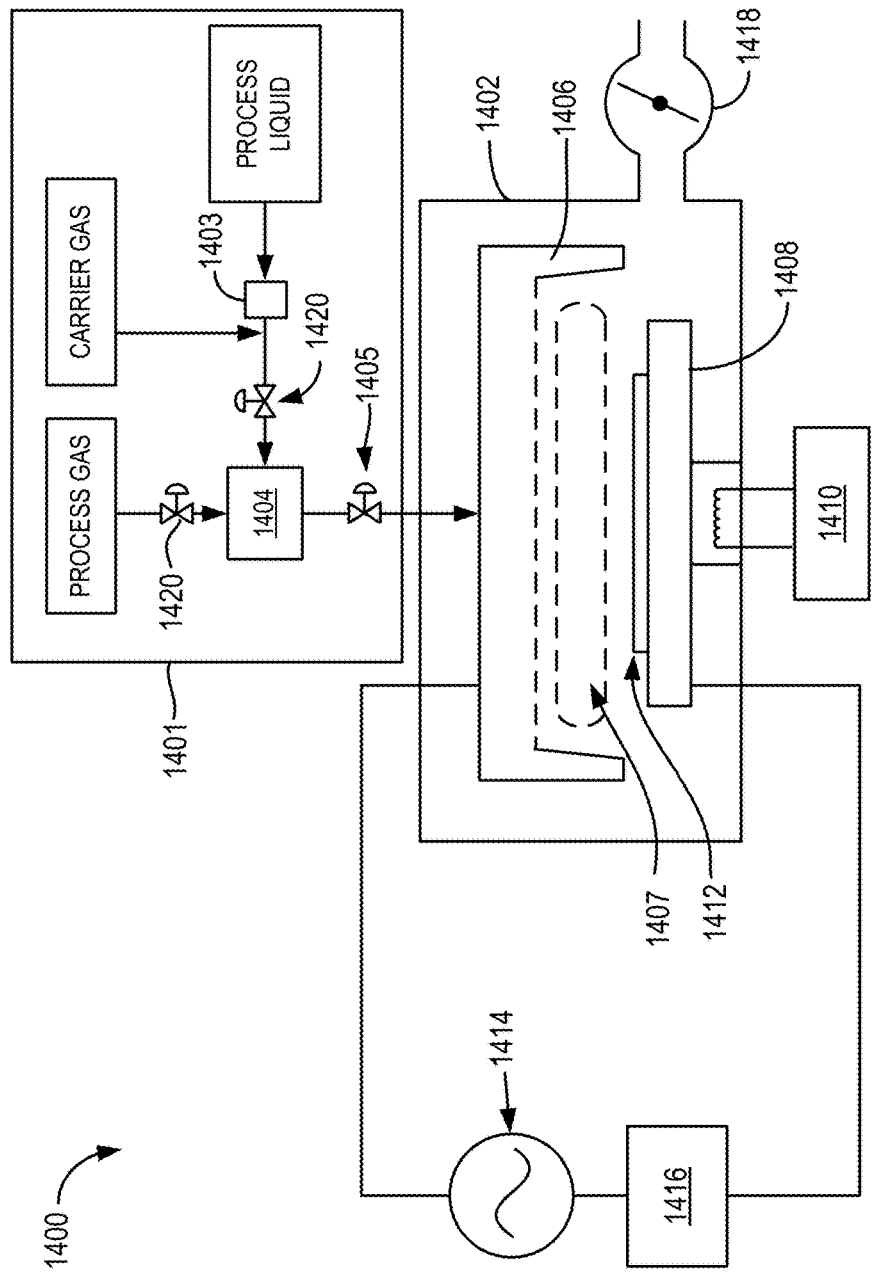
FIG. 14 illustrates a reaction chamber that may be used for deposition according to certain embodiments.

FIG. 14 schematically shows an embodiment of a process station 1400 that may be used to deposit material using atomic layer deposition (ALD) and/or chemical vapor deposition (CVD), either of which may be plasma enhanced. For simplicity, the process station 1400 is depicted as a stand-alone process station having a process chamber body 1402 for maintaining a low-pressure environment. However, it will be appreciated that a plurality of process stations 1400 may be included in a common process tool environment. Further, it will be appreciated that, in some embodiments, one or more hardware parameters of process station 1400, including those discussed in detail below, may be adjusted programmatically by one or more computer controllers.

Process station 1400 fluidly communicates with reactant delivery system 1401 for delivering process gases to a distribution showerhead 1406. Reactant delivery system 1401 includes a mixing vessel 1404 for blending and/or conditioning process gases for delivery to showerhead 1406. One or more mixing vessel inlet valves 1420 may control introduction of process gases to mixing vessel 1404. Similarly, a showerhead inlet valve 1405 may control introduction of process gasses to the showerhead 1406.

Some reactants, like BTBAS, may be stored in liquid form prior to vaporization at and subsequent delivery to the process station. For example, the embodiment of FIG. 14 includes a vaporization point 1403 for vaporizing liquid reactant to be supplied to mixing vessel 1404. In some embodiments, vaporization point 1403 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1403 may be heat traced. In some examples, mixing vessel 1404 may also be heat traced. In one non-limiting example, piping downstream of vaporization point 1403 has an increasing temperature profile extending from approximately 100° C. to approximately 150° C. at mixing vessel 1404.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1403. In one scenario, a liquid injector may be mounted directly to mixing vessel 1404. In another scenario, a liquid injector may be mounted directly to showerhead 1406.

In some embodiments, a liquid flow controller upstream of vaporization point 1403 may be provided for controlling a mass flow of liquid for vaporization and delivery to process station 1400. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 1406 distributes process gases toward substrate 1412. In the embodiment shown in FIG. 14, substrate 1412 is located beneath showerhead 1406, and is shown resting on a pedestal 1408. It will be appreciated that showerhead 1406 may have any suitable shape, and may have any suitable number and arrangement of ports for distributing processes gases to substrate 1412.

In some embodiments, a microvolume 1407 is located beneath showerhead 1406. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 1408 may be raised or lowered to expose substrate 1412 to microvolume 1407 and/or to vary a volume of microvolume 1407. For example, in a substrate transfer phase, pedestal 1408 may be lowered to allow substrate 1412 to be loaded onto pedestal 1408. During a deposition process phase, pedestal 1408 may be raised to position substrate 1412 within microvolume 1407. In some embodiments, microvolume 1407 may completely enclose substrate 1412 as well as a portion of pedestal 1408 to create a region of high flow impedance during a deposition process.

Optionally, pedestal 1408 may be lowered and/or raised during portions the deposition process to modulate process pressure, reactant concentration, etc., within microvolume 1407. In one scenario where process chamber body 1402 remains at a base pressure during the deposition process, lowering pedestal 1408 may allow microvolume 1407 to be evacuated. Example ratios of microvolume to process chamber volume include, but are not limited to, volume ratios between 1:1400 and 1:10. It will be appreciated that, in some embodiments, pedestal height may be adjusted programmatically by a suitable computer controller.

In another scenario, adjusting a height of pedestal 1408 may allow a plasma density to be varied during plasma activation and/or treatment cycles included in the deposition process. At the conclusion of the deposition process phase, pedestal 1408 may be lowered during another substrate transfer phase to allow removal of substrate 1412 from pedestal 1408.

While the example microvolume variations described herein refer to a height-adjustable pedestal, it will be appreciated that, in some embodiments, a position of showerhead 1406 may be adjusted relative to pedestal 1408 to vary a volume of microvolume 1407. Further, it will be appreciated that a vertical position of pedestal 1408 and/or showerhead 1406 may be varied by any suitable mechanism within the scope of the present disclosure. In some embodiments, pedestal 1408 may include a rotational axis for rotating an orientation of substrate 1412. It will be appreciated that, in some embodiments, one or more of these example adjustments may be performed programmatically by one or more suitable computer controllers.

Returning to the embodiment shown in FIG. 14, showerhead 1406 and pedestal 1408 electrically communicate with RF power supply 1414 and matching network 1416 for powering a plasma. In some embodiments, the plasma energy may be controlled by controlling one or more of a process station pressure, a gas concentration, an RF source power, an RF source frequency, and a plasma power pulse timing. For example, RF power supply 1414 and matching network 1416 may be operated at any suitable power to form a plasma having a desired composition of radical species. Examples of suitable powers are included above. Likewise, RF power supply 1414 may provide RF power of any suitable frequency. In some embodiments, RF power supply 1414 may be configured to control high- and low-frequency RF power sources independently of one another. Example low-frequency RF frequencies may include, but are not limited to, frequencies between 50 kHz and 1400 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 1408 may be temperature controlled via heater 1410. Further, in some embodiments, pressure control for deposition process station 1400 may be provided by butterfly valve 1418. As shown in the embodiment of FIG. 14, butterfly valve 1418 throttles a vacuum provided by a downstream vacuum pump (not shown). However, in some embodiments, pressure control of process station 1400 may also be adjusted by varying a flow rate of one or more gases introduced to process station 1400.

Figure 15:
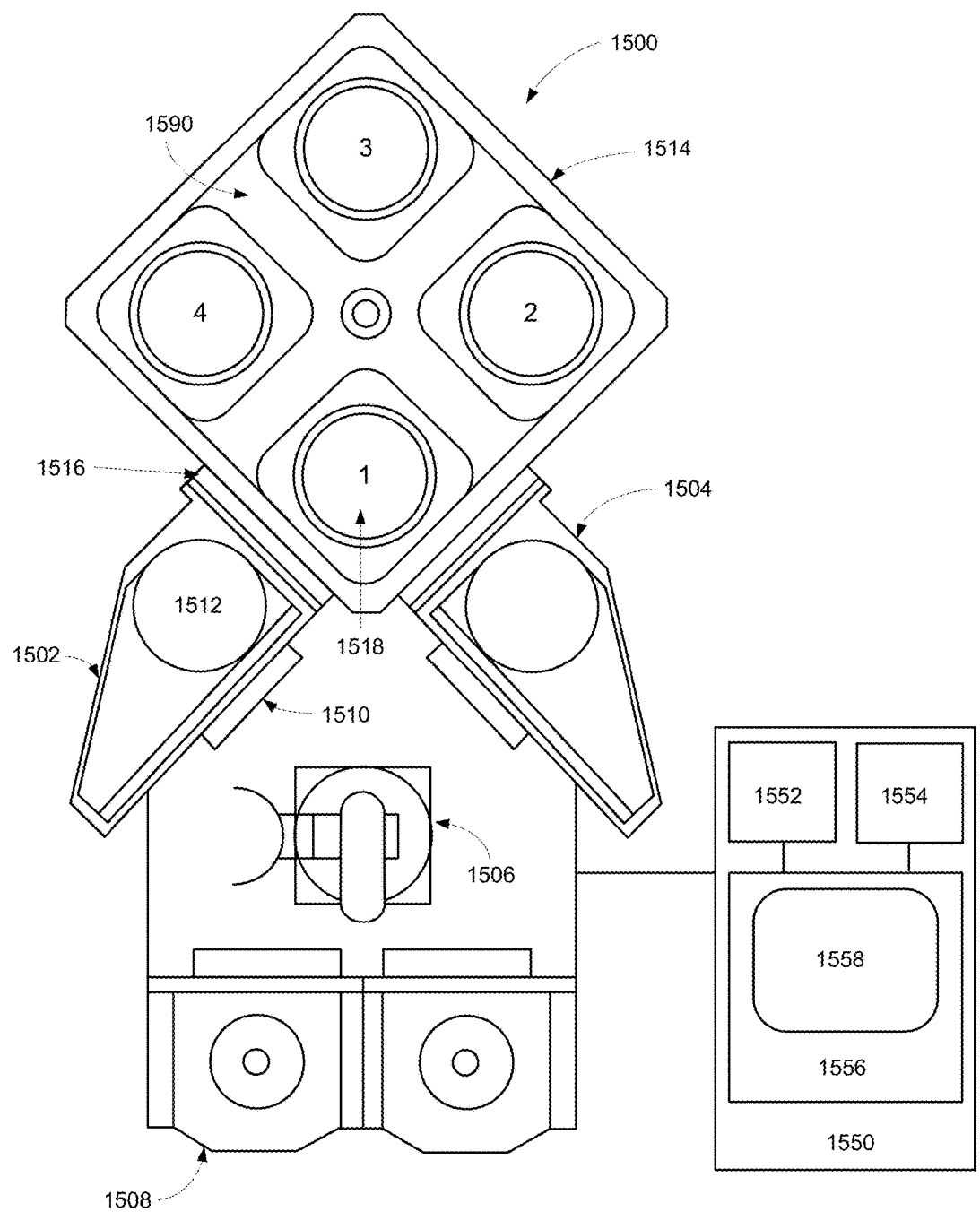
FIG. 15 depicts a multi-station reaction chamber that may be used for deposition according to certain embodiments.

FIG. 15 shows a schematic view of an embodiment of a multi-station processing tool 1500 with an inbound load lock 1502 and an outbound load lock 1504, either or both of which may comprise a remote plasma source. A robot 1506, at atmospheric pressure, is configured to move wafers from a cassette loaded through a pod 1508 into inbound load lock 1502 via an atmospheric port 1510. A wafer is placed by the robot 1506 on a pedestal 1512 in the inbound load lock 1502, the atmospheric port 1510 is closed, and the load lock is pumped down. Where the inbound load lock 1502 comprises a remote plasma source, the wafer may be exposed to a remote plasma treatment in the load lock prior to being introduced into a processing chamber 1514. Further, the wafer also may be heated in the inbound load lock 1502 as well, for example, to remove moisture and adsorbed gases. Next, a chamber transport port 1516 to processing chamber 1514 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 1514 comprises four process stations, numbered from 1 to 4 in the embodiment shown in FIG. 15. Each station has a heated pedestal (shown at 1518 for station 1), and gas line inlets. It will be appreciated that in some embodiments, each process station may have different or multiple purposes. While the depicted processing chamber 1514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 15 also depicts an embodiment of a wafer handling system 1590 for transferring wafers within processing chamber 1514. In some embodiments, wafer handling system 1590 may transfer wafers between various process stations and/or between a process station and a load lock. It will be appreciated that any suitable wafer handling system may be employed. Non-limiting examples include wafer carousels and wafer handling robots. FIG. 15 also depicts an embodiment of a system controller 1550 employed to control process conditions and hardware states of process tool 1500. System controller 1550 may include one or more memory devices 1556, one or more mass storage devices 1554, and one or more processors 1552. Processor 1552 may include a CPU or computer, analog and/or digital input/output connections, stepper motor controller boards, etc.

In some embodiments, system controller 1550 controls all of the activities of process tool 1500. System controller 1550 executes system control software 1558 stored in mass storage device 1554, loaded into memory device 1556, and executed on processor 1552. System control software 1558 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 1500. System control software 1558 may be configured in any suitable way. For example, various process tool component subroutines or control objects may be written to control operation of the process tool components necessary to carry out various process tool processes in accordance with the disclosed methods. System control software 1558 may be coded in any suitable computer readable programming language.

In some embodiments, system control software 1558 may include input/output control (IOC) sequencing instructions for controlling the various parameters described above. For example, each phase of a PEALD process may include one or more instructions for execution by system controller 1550. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 1554 and/or memory device 1556 associated with system controller 1550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1518 and to control the spacing between the substrate and other parts of process tool 1500.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 1550. The user interface may include a display screen, graphical software displays of the apparatus and/or process conditions, and user input devices such as pointing devices, keyboards, touch screens, microphones, etc.

In some embodiments, parameters adjusted by system controller 1550 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 1550 from various process tool sensors. The signals for controlling the process may be output on the analog and digital output connections of process tool 1500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, Striker™ product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 16:
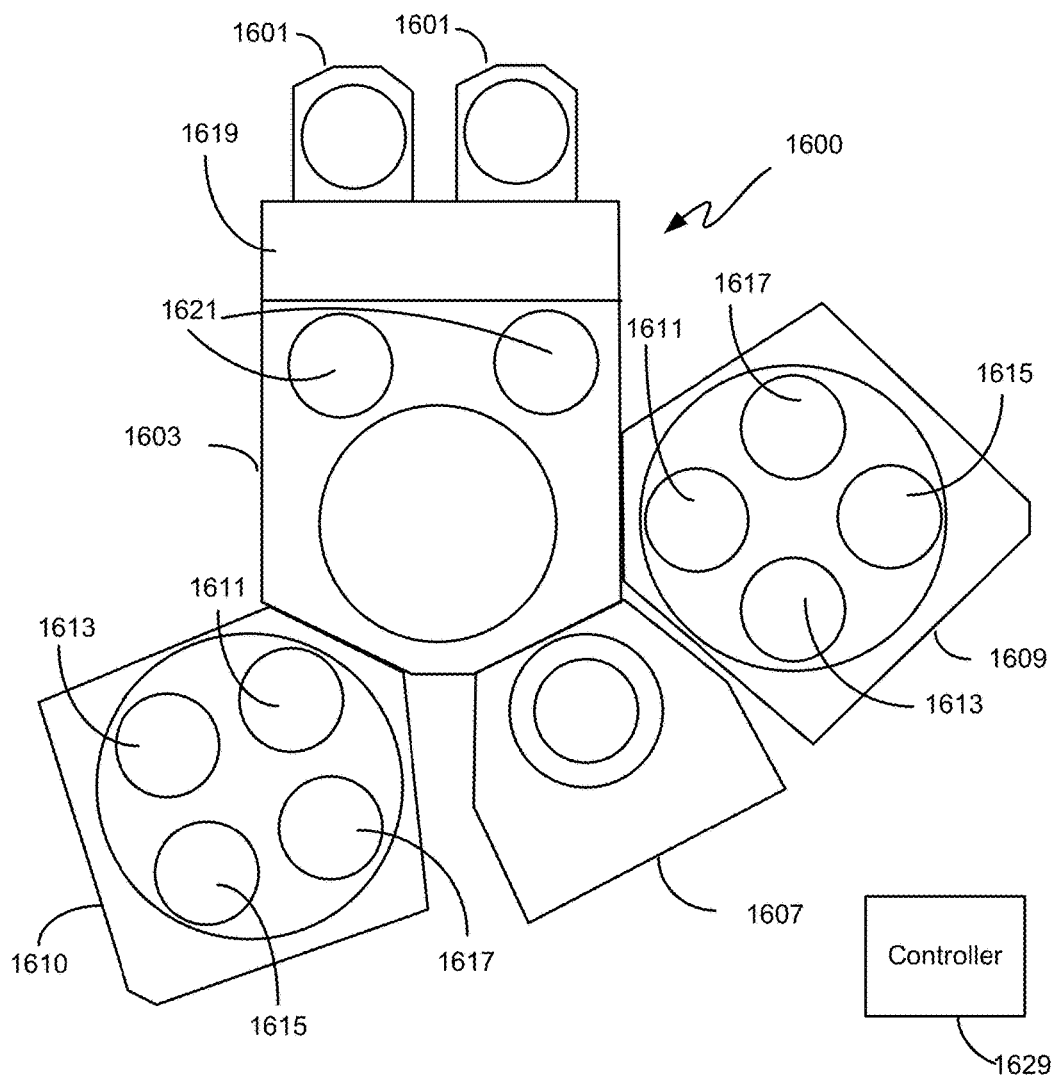
FIG. 16 illustrates a cluster tool that may be used to process substrates according to certain embodiments.

FIG. 16 is a block diagram of a processing system suitable for conducting thin film deposition processes in accordance with certain embodiments. The system 1600 includes a transfer module 1603. The transfer module 1603 provides a clean, pressurized environment to minimize risk of contamination of substrates being processed as they are moved between various reactor modules. Mounted on the transfer module 1603 are two multi-station reactors 1609 and 1610, each capable of performing atomic layer deposition (ALD) and/or chemical vapor deposition (CVD) according to certain embodiments. Reactors 1609 and 1610 may include multiple stations 1611, 1613, 1615, and 1617 that may sequentially or non-sequentially perform operations in accordance with disclosed embodiments. The stations may include a heated pedestal or substrate support, one or more gas inlets or showerhead or dispersion plate.

Also mounted on the transfer module 1603 may be one or more single or multi-station modules 1607 capable of performing plasma or chemical (non-plasma) pre-cleans, or any other processes described in relation to the disclosed methods. The module 1607 may in some cases be used for various treatments to, for example, prepare a substrate for a deposition process. The module 1607 may also be designed/configured to perform various other processes such as etching or polishing. The system 1600 also includes one or more wafer source modules 1601, where wafers are stored before and after processing. An atmospheric robot (not shown) in the atmospheric transfer chamber 1619 may first remove wafers from the source modules 1601 to loadlocks 1621. A wafer transfer device (generally a robot arm unit) in the transfer module 1603 moves the wafers from loadlocks 1621 to and among the modules mounted on the transfer module 1603.

In various embodiments, a system controller 1629 is employed to control process conditions during deposition. The controller 1629 will typically include one or more memory devices and one or more processors. A processor may include a CPU or computer, analog and/or digital input/output connections, stepper motor controller boards, etc.

The controller 1629 may control all of the activities of the deposition apparatus. The system controller 1629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1629 may be employed in some embodiments.

Typically there will be a user interface associated with the controller 1629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 1629. The signals for controlling the process are output on the analog and digital output connections of the deposition apparatus 1600.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 1629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system. In various embodiments, the controller may include executable program instructions for forming a nanolaminate layer on a substrate as described herein.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of patterning a substrate, the method comprising:
   providing a substrate comprising a core layer, wherein the core layer is patterned;
   forming a nanolaminate film on the core layer, the nanolaminate film comprising a stack comprising layers of a first film interleaved with layers of a second film,
      wherein (i) the first film and the second film have different compositions, and/or (ii) the layers of the first film and the layers of the second film are formed using different reaction conditions,
      wherein the layers of the first film each have a thickness between about 0.5-2Å, wherein the layers of the second film each have a thickness between about 0.5-2Å, and wherein the nanolaminate film has a thickness between about 50-300Å; and
   etching the nanolaminate film to expose the core layer, wherein portions of the nanolaminate film remain on the substrate after etching.

2. The method of claim 1, wherein the stack comprises at least about 50 layers of the first film interleaved with at least about 50 layers of the second film.

3. The method of claim 2, wherein the layers of the first film and the layers of the second film are each formed through a single deposition cycle comprising:
   exposing the substrate to a first reactant in vapor phase and allowing the first reactant to adsorb onto the substrate;
   exposing the substrate to a second reactant in vapor phase and allowing the second reactant to adsorb onto the substrate; and
   exposing the substrate to plasma to drive a surface reaction between the first reactant and the second reactant.

4. The method of claim 1, wherein the first film has a different composition than the second film.

5. The method of claim 4, wherein the first film comprises silicon oxide and the second film comprises metal oxide.

6. The method of claim 5, further comprising forming metal silicates at an interface between the layer of the first film and the layer of the second film.

7. The method of claim 4, wherein the first film comprises a first metal oxide and the second film comprises a second metal oxide, the first and second metal oxides comprising different metals.

8. The method of claim 1, wherein the first film and second film each comprise silicon oxide, and wherein the layer of the first film is deposited under different conditions than the layer of the second film.

9. The method of claim 1, wherein the first film and second film each comprise metal oxide, and wherein the layer of the first film is deposited under different conditions than the layer of the second film.

10. The method of claim 1, wherein the layer of the first film is deposited under different conditions than the layer of the second film, the conditions that are different relating to one or more parameters selected from the group consisting of: identity of reactants, duration of reactant exposure, RF power, duration of RF exposure, RF frequency, substrate temperature, and pressure.

11. The method of claim 1, wherein the first film comprises a metal oxide selected from the group consisting of: scandium oxide, yttrium oxide, lanthanum oxide, titanium oxide, zirconium oxide, hafnium oxide, vanadium oxide, niobium oxide, tantalum oxide, tin oxide, and manganese oxide.

12. The method of claim 1, wherein all layers in the nanolaminate film are deposited through atomic layer deposition or conformal film deposition mechanisms.

13. The method of claim 1, wherein the layer of the first film is formed by exposing the substrate to a plasma generated at an RF power between about 700-1770 W/m$^2$, wherein each time the substrate is exposed to the plasma while forming the layer of the first film, a duration of plasma exposure is between about 0.1-0.5 seconds.

14. The method of claim 13, wherein during formation of the layer of the first film, the substrate is maintained at a temperature of about 300° C. or less.

15. The method of claim 1, wherein the core layer is patterned to include a plurality of raised features, wherein after etching, the nanolaminate film (i) is removed from areas above the raised features, and (ii) remains in sidewalls that abut the raised features.

16. The method of claim 1, wherein the nanolaminate film is formed as a spacer layer while performing a double patterning scheme or a quadruple patterning scheme.

17. The method of claim 1, wherein the method is repeated at least once such that the nanolaminate film forms over the core layer and a second nanolaminate film forms over a second core layer, wherein the method is performed while performing a quadruple patterning scheme.

18. An apparatus for depositing a nanolaminate film on a substrate, the apparatus comprising:
   a reaction chamber;
   an inlet for providing gas phase reactants to the reaction chamber;
   an outlet for removing gas phase reactants and byproducts from the reaction chamber;
   a substrate support;
   a plasma generator; and
   a controller comprising computer executable instructions for:
      forming a nanolaminate film on the substrate, the nanolaminate film comprising a stack comprising layers of a first film interleaved with layers of a second film,
      wherein (i) the first film and the second film have different compositions, and/or (ii) the layers of the first film and the layers of the second film are formed using different reaction conditions,
      wherein the layers of the first film each have a thickness between about 0.5-2Å, wherein the layers of the second film each have a thickness between about 0.5-2Å, and wherein the nanolaminate film has a thickness between about 50-300Å.

* * * * *